(12) United States Patent
Wang

(10) Patent No.: US 12,389,634 B2
(45) Date of Patent: Aug. 12, 2025

(54) SEMICONDUCTOR DEVICE AND METHOD OF FABRICATING A SEMICONDUCTOR DEVICE

(71) Applicant: Taiwan Semiconductor Manufacturing Company, Ltd., Hsinchu (TW)

(72) Inventor: Pei-Yu Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 574 days.

(21) Appl. No.: 17/750,402

(22) Filed: May 23, 2022

(65) Prior Publication Data
US 2023/0378299 A1 Nov. 23, 2023

(51) Int. Cl.
*H10D 30/67* (2025.01)
*H10D 30/01* (2025.01)
*H10D 64/01* (2025.01)

(52) U.S. Cl.
CPC ....... *H10D 30/6735* (2025.01); *H10D 30/031* (2025.01); *H10D 30/6713* (2025.01); *H10D 30/6757* (2025.01); *H10D 64/018* (2025.01)

(58) Field of Classification Search
CPC ............. H10D 30/6735; H10D 30/031; H10D 30/6713; H10D 30/6757; H10D 30/435; H10D 30/501; H10D 64/018; H10D 64/252; H10D 84/0188; H10D 84/903; H10D 62/119; H10D 62/121; Y10S 977/938
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0343376 A1* | 10/2020 | Chiang ............ H01L 29/66545 |
| 2023/0053379 A1* | 2/2023 | Choi ................ H01L 29/41766 |

* cited by examiner

*Primary Examiner* — Ajay Ojha
*Assistant Examiner* — Sandra Milena Rodriguez Villanu
(74) *Attorney, Agent, or Firm* — JCIPRNET

(57) ABSTRACT

A semiconductor device including an embedded channel structure, a sidewall channel structure and a gate electrode structure is provided. The embedded channel structure is disposed on a substrate. The sidewall channel structure is disposed on the substrate, and located at a lateral side of the embedded channel structure. The gate electrode structure is disposed on the substrate, encircles the embedded channel structure and is located between the embedded channel structure and the sidewall channel structure.

20 Claims, 29 Drawing Sheets

SEMICONDUCTOR DEVICE AND METHOD OF FABRICATING A SEMICONDUCTOR DEVICE

BACKGROUND

Technical Field

The disclosure is related to a semiconductor device and a method of fabricating a semiconductor device.

Description of Related Art

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching techniques to form circuit components and elements thereon.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
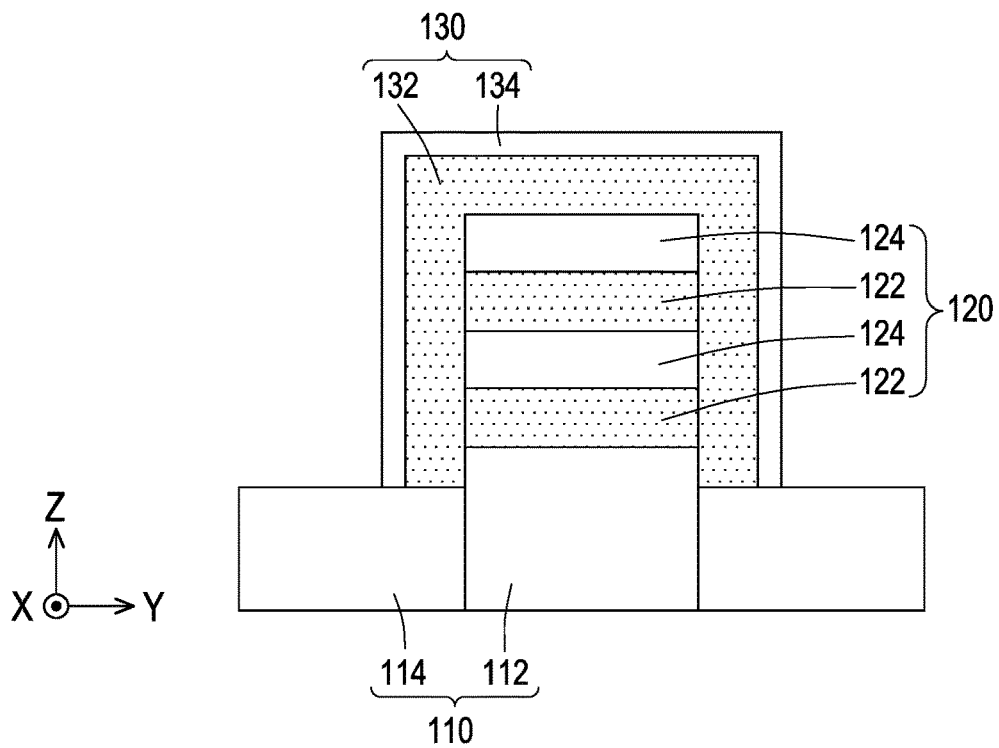
FIG. 1 to FIG. 6 schematically illustrate a method of fabricating a semiconductor device from a cross sectional view in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Unless other specified, the same or similar reference numerals in different figures refer to the same or similar component formed by a same or similar process(es) using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In some embodiments, a gate-all-around (GAA) field-effect transistor (FET) device includes a semiconductor strip protruding above a substrate, and a first isolation region and a second isolation region on opposing sides of the semiconductor strip. The GAA FET device also includes nanowires over and aligned with the semiconductor strip, and source/drain regions at opposing ends of the nanowires. The GAA FET device further includes a first dielectric fin on the first isolation region, and a gate electrode around the nanowires and around center portions of the first dielectric fin, where end portions of the first dielectric fin are disposed on opposing sides of the gate electrode, and the end portions of the first dielectric fin are wider than the center portions of the first dielectric fin.

FIG. 1 to FIG. 6 schematically illustrate a method of fabricating a semiconductor device from a cross sectional view in accordance with some embodiments of the disclosure. Referring to the X-axis, the Y-axis and the Z-axis, FIG. 1 to FIG. 6 depict the cross section of the structure cut along Y-axis under respective steps. In FIG. 1, a substrate 110 including a semiconductor strip 112 and an isolation structure 114 is provided. The semiconductor strip 112 is a protruded structure of the substrate 110 and is laterally surrounded by the isolation structure 114. An epitaxial stack 120 may be disposed on the semiconductor strip 112 and specifically, on top of the semiconductor strip 112. In addition, an epitaxial cap 130 is formed on the epitaxial stack 120 and on the isolation structure 114. The epitaxial cap 130 may cover the top surface and the sidewall of the epitaxial stack 120 to form a cap-like shape. In some embodiments, the substrate 110 may have a plurality of semiconductor strips 112 each extending along the X-axis, and FIG. 1 presents the structure that one semiconductor strip 112 is cut along the width direction, the Y-axis, of the semiconductor strip 112 for illustration purpose.

The substrate 110 may be a semiconductor substrate, such as a bulk semiconductor (e.g., bulk silicon), a semiconductor-on-insulator (SOI) substrate, or the like, which may be doped (e.g., with a P-type or an N-type dopant) or undoped. The substrate 110 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 includes silicon, germanium, a compound semiconductor including silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof.

In some embodiments, predetermined numbers of epitaxial layers may be formed on the semiconductor material of the substrate 110 through an epitaxial technique. A patterning process including an etching step is performed to remove a portion of the epitaxial layers and a portion of the semiconductor material of the substrate 110 to form trenches which define the semiconductor strip 112 and the epitaxial stack 120 over the semiconductor strip 112. The etching may be any acceptable etch process, such as a reactive ion etch (RIE), neutral beam etch (NBE), the like, or a combination thereof. The etch may be anisotropic. After patterning the semiconductor strip 112, the isolation structure 114 may be formed by filling dielectric material in the trenches which define the semiconductor trip 112. The isolation structure 114 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

The epitaxial stack 120 may includes first epitaxial layers 122 and second epitaxial layers 124 alternately formed on the semiconductor strip 112 through an epitaxial growth process, which may be performed in a growth chamber. The first epitaxial layers 122 are formed of a first semiconductor material and the second epitaxial layer 124 are formed of a second semiconductor material that is different from the first semiconductor material. For example, the first semiconductor material is silicon germanium ($Si_xGe_{1-x}$, where x can be in the range of 0 to 1), and the second semiconductor material is silicon. In some embodiments, the second epitaxial layer 124 may be of the same material as the semiconductor strip 112, but the disclosure is not limited thereto. The numbers of the first epitaxial layers 122 and the numbers of the second epitaxial layers 124 may be the same. In some embodiments, the numbers of the first epitaxial layers 122 or the second epitaxial layers 124 may be 1 to 5 layers. In addition, the top most layer of the epitaxial stack 120 may be the second epitaxial layer 124.

The epitaxial cap 130 may be formed on the epitaxial stack 120 over the semiconductor strip 112 through an epitaxial technique. The epitaxial cap 130 may include a first cap layer 132 and a second cap layer 134 sequentially formed on the epitaxial stack 120. In some embodiments, the first cap layer 132 is selectively grown on exposed surfaces of the epitaxial stack 120 over the semiconductor strip 112 and the second cap layer 134 is selectively grown on exposed surfaces of the first cap layer 132. The first cap layer 132 may be the same material as the first epitaxial layer 122, for example silicon germanium ($Si_xGe_{1-x}$, where x can be in the range of 0 to 1) and the second cap layer 134 may be the same material as the second epitaxial layer 124, for example silicon. A portion of the first cap layer 132 and a portion of the second cap layer 134 may be formed by laterally growing from the sidewall of the epitaxial stack 120 and may have a crystal orientation different from another portion of the first cap layer 132 and another portion of the second cap layer 134 that are vertically grown from the top of the epitaxial stack 120.

In some embodiments, the first cap layer 132 may be thicker than the second cap layer 134. In some embodiments, the thickness of the second cap layer 134 may be from 1 nanometer to 5 nanometers. As shown in FIG. 1, the epitaxial cap 120 is conformal to the exposed surfaces of the epitaxial stack 120 and the semiconductor strip 112. In addition, the first cap layer 132 and the second cap layer 134 may both disposed directly on the isolation structure 114. In other words, the first cap layer 132 and the second cap layer 134 may both be in contact with the top surface of the isolation structure 114.

Figure 2:
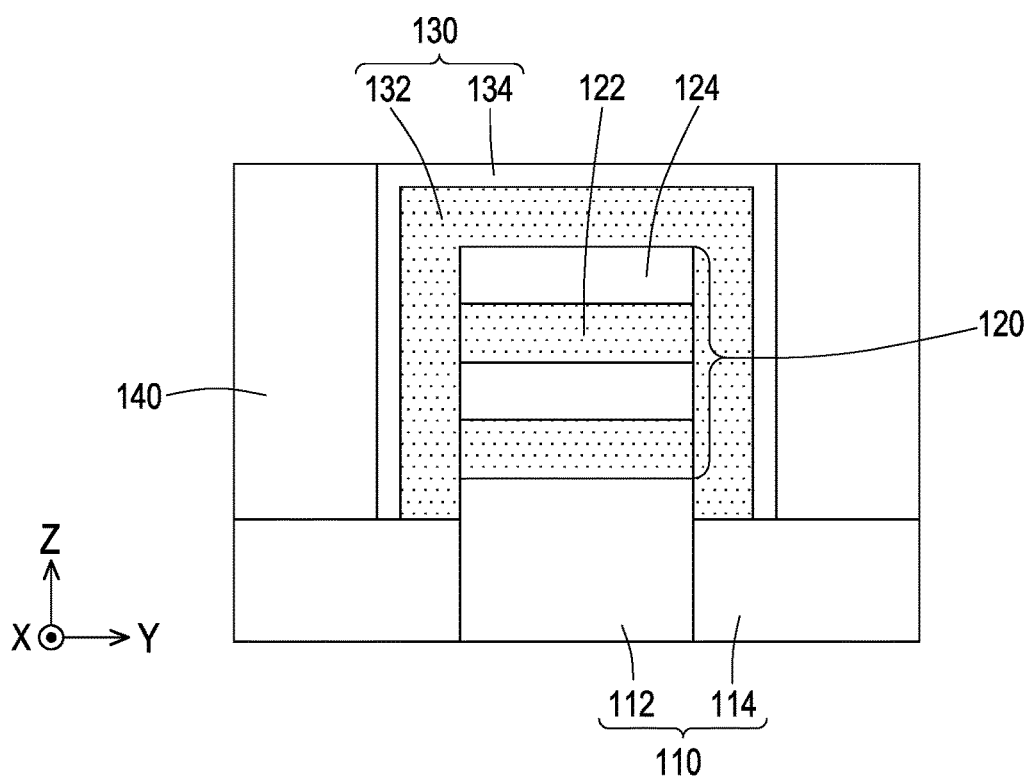

In FIG. 2, dielectric fins 140 are formed at a lateral side of the epitaxial cap 130 in the Y-axis. The dielectric fins 140 are formed by a low-K dielectric material on the isolation structure 114 of the substrate 110. The low-K dielectric material may have a dielectric constant K smaller than about 7, such as smaller than about 3.9, and may include $SiO_2$, SiN, SiCN, or SiOCN. In some embodiments, the dielectric fins 140 may be in contact with the isolation structure 114 similar to the epitaxial cap 130. In some embodiments, a planarization process, such as CMP, may be performed so that the top surface of the epitaxial cap 130 is revealed and the tops of the dielectric fin 140 and the epitaxial cap 130 are coplanar as shown in FIG. 2. In other words, the top of the epitaxial cap 130 may not be covered by the dielectric fins 140.

Figure 3:
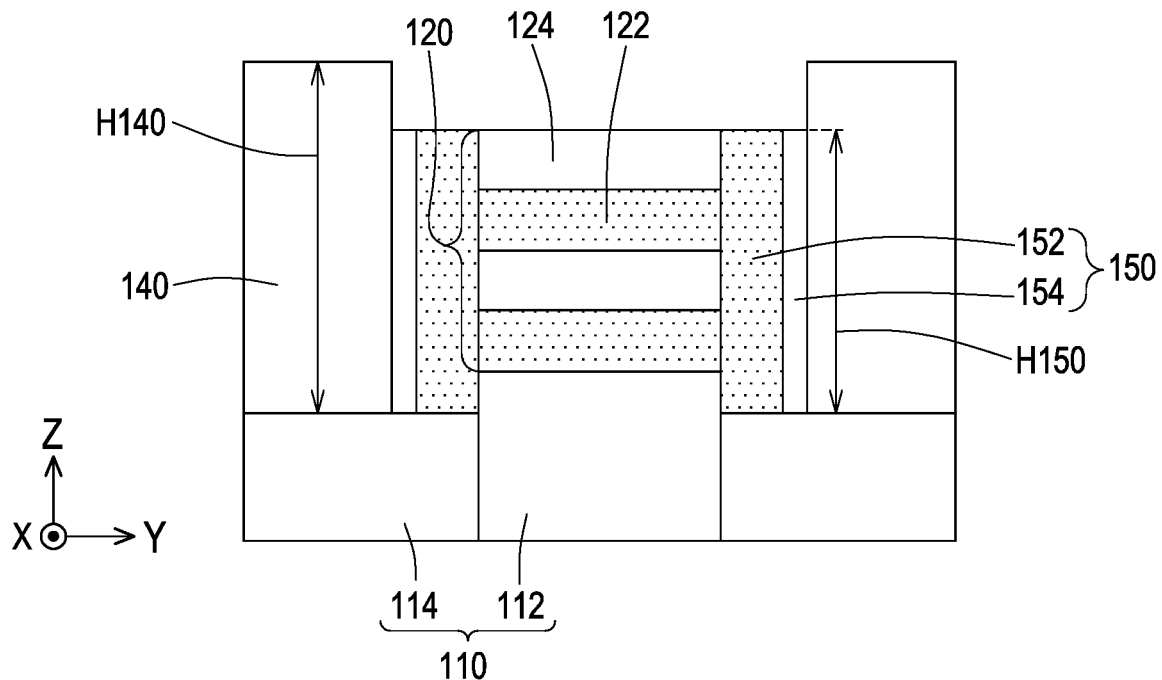

Thereafter, a removal process is performed to remove a portion of the epitaxial cap 130 from the exposed surface of the epitaxial cap 130 so that the epitaxial cap 130 is patterned to epitaxial sidewalls 150 as shown in FIG. 3. The removal process may include etching process that is able to etch back the epitaxial cap 130 until the top most layer, the second epitaxial layer 124, of the epitaxial stack 120 is revealed. In FIG. 3, the height H150 of the epitaxial sidewalls 150 may be lower than the height H140 of the dielectric fin 140. The top of the epitaxial stack 120 may be co-leveled to the top of the epitaxial sidewalls 150. Specifically, the epitaxial sidewall 150 may include a first sidewall 152 that is formed from the first cap layer 132 and a second sidewall 154 that is formed from the second cap layer 134. The top of the top most second epitaxial layer 124 of the epitaxial stack 120, the top of the first sidewall 152 and the top of the second sidewall 154 are substantially co-leveled and lowed than the top of the dielectric fin 140 to form a recess structure, but the disclosure is not limited thereto.

Figure 4:
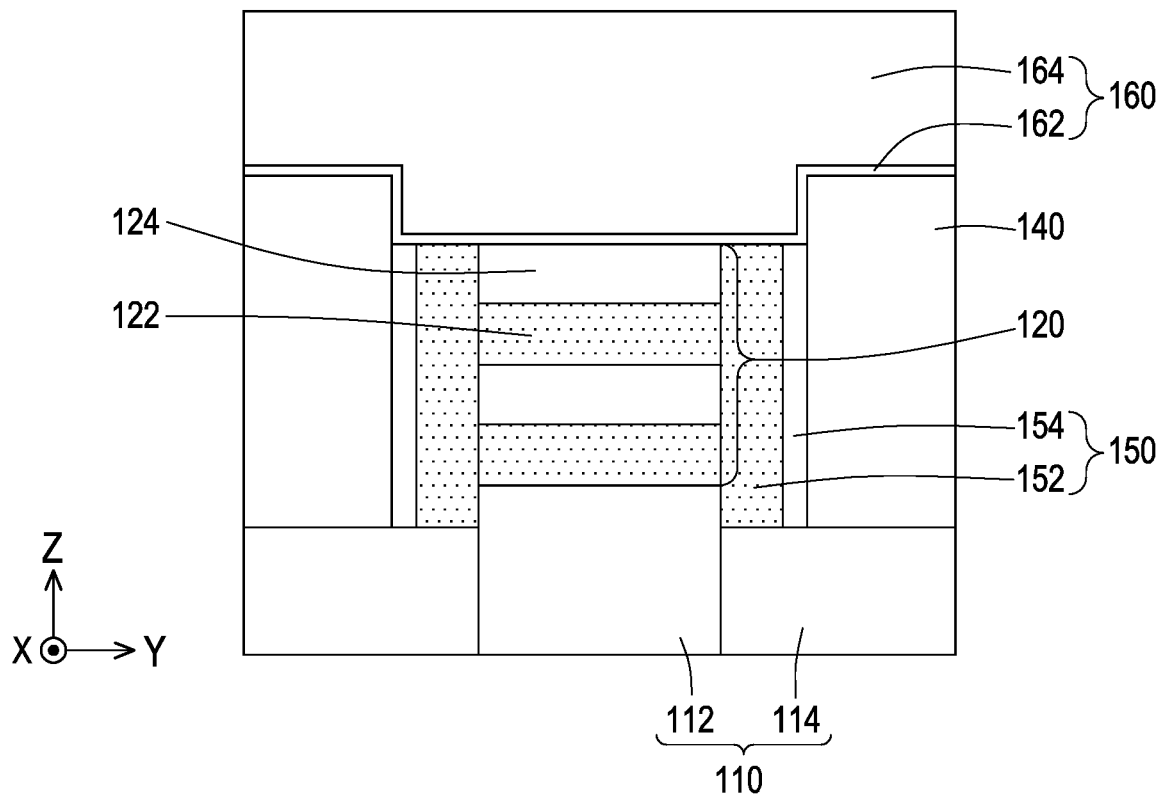

In FIG. 4, a dummy gate structure 160 is formed on the structure of FIG. 3. The dummy gate structure 160 may include a gate dielectric 162 and a dummy gate electrode 164. The gate dielectric 162 may be conformally form on tops of the dielectric fin 140, the epitaxial sidewall 150 and the epitaxial stack 120. The gate dielectric 162 may be, for example, silicon oxide, silicon nitride, multilayers thereof, or the like, and may be deposited or thermally grown. The dummy gate electrode 164 may be formed on the gate dielectric 162 using the material, for example, polysilicon, or the like. The dummy gate structure 160 may be patterned to have a strip shape that extends along Y-axis and across the epitaxial stack 120 and the epitaxial sidewall 150 between the dielectric fins 140. In other words, the extension direction of the dummy gate structure 160 may be substantially parallel to Y-axis. The dummy gate structure 160 may have a lengthwise direction substantially perpendicular to the lengthwise direction of the semiconductor strips 112 or the lengthwise direction of the dielectric fins 140.

After forming the dummy gate structure 160, the step of forming a spacer structure, the step of forming the channel structure, the step of forming source/drain structures and the step of forming a replacement-gate (RPG) may be selectively performed. The spacer structure is disposed at opposite sides of the dummy gate structure 160 in the X-axis, and the source/drain structures are disposed at opposite sides of the epitaxial stack 120 and opposite sides of the epitaxial sidewall 150 in the X-axis, which are not presented in the cross section taken along the Y-axis. Therefore, the descriptions for the step of forming a spacer structure, the step of forming a source/drain structure may refer to other embodiments in this disclosure while be omitted in this embodiment. In addition, before the step of forming source/drain structures, the semiconductor strip 112, the epitaxial stack 120 and the epitaxial sidewalls 150 are patterned so that the semiconductor strip 112, the second epitaxial layers 124 of the epitaxial stack 120 and the second sidewalls 154 of the epitaxial sidewall 150 may be patterned to have a width in the X-axis similar to the width of the dummy gate structure 160. The structures of the cross sections taken along X-axis with respect to the above steps may refer to other embodiments in the disclosure and be omitted in this embodiment showing the cross sections taken along Y-axis.

Figure 5:
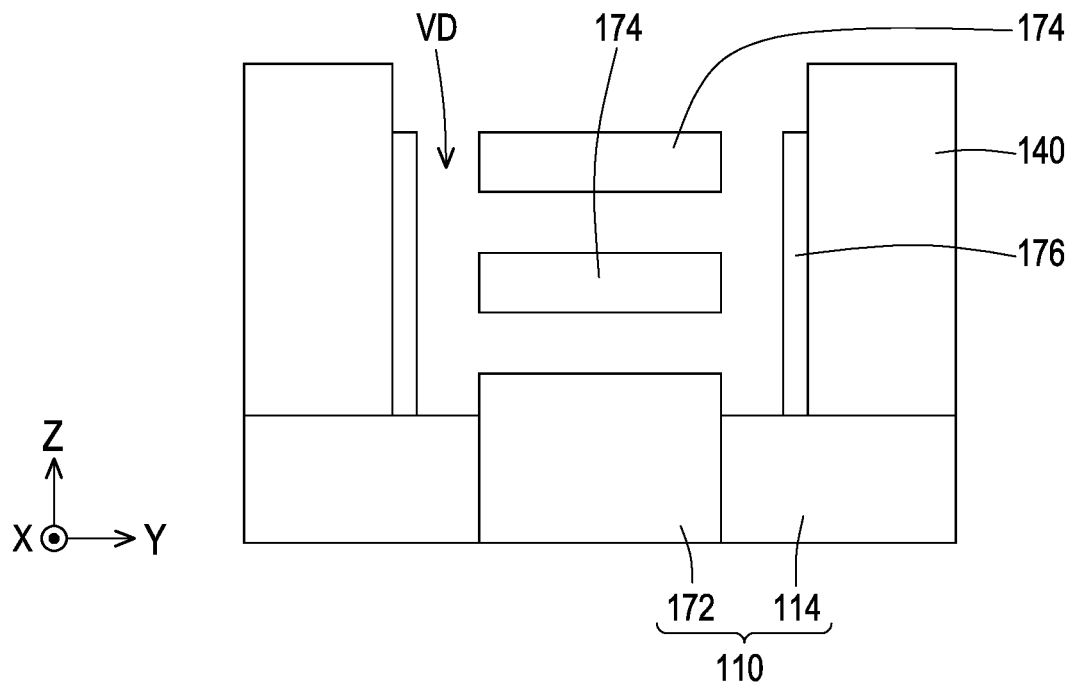

In some embodiments, at the step of forming the channel structure, the semiconductor strip 112, the epitaxial stack 120 and the epitaxial sidewalls 150 are patterned. In addition, the dummy gate electrode 164 may be removed, and then the first sidewalls 152 of the epitaxial sidewalls 150 and the first epitaxial layers 122 of the epitaxial stack 120 may be removed by a selective removal process. Therefore, the structure shown in FIG. 5 is obtained. Specifically, the semiconductor strip 112 of the substrate 110 is patterned to form a bottom channel structure 172, the second epitaxial layers 124 are patterned to form embedded channel structures 174, and the second epitaxial sidewalls 154 are patterned to form sidewall channel structures 176. The removal of the first sidewalls 152 of the epitaxial sidewalls 150 and the first epitaxial layers 122 of the epitaxial stack 120 forms the gap VD. The bottom channel structure 172, the embedded channel structures 174 and the sidewall channel structures 176 are exposed between the dielectric fins 140, between the source/drawn structures (not shown and may refer to the embodiment showing the cross section in X-axis), and between spacer structures (not shown and may refer to the embodiment showing the cross section in X-axis).

Figure 6:
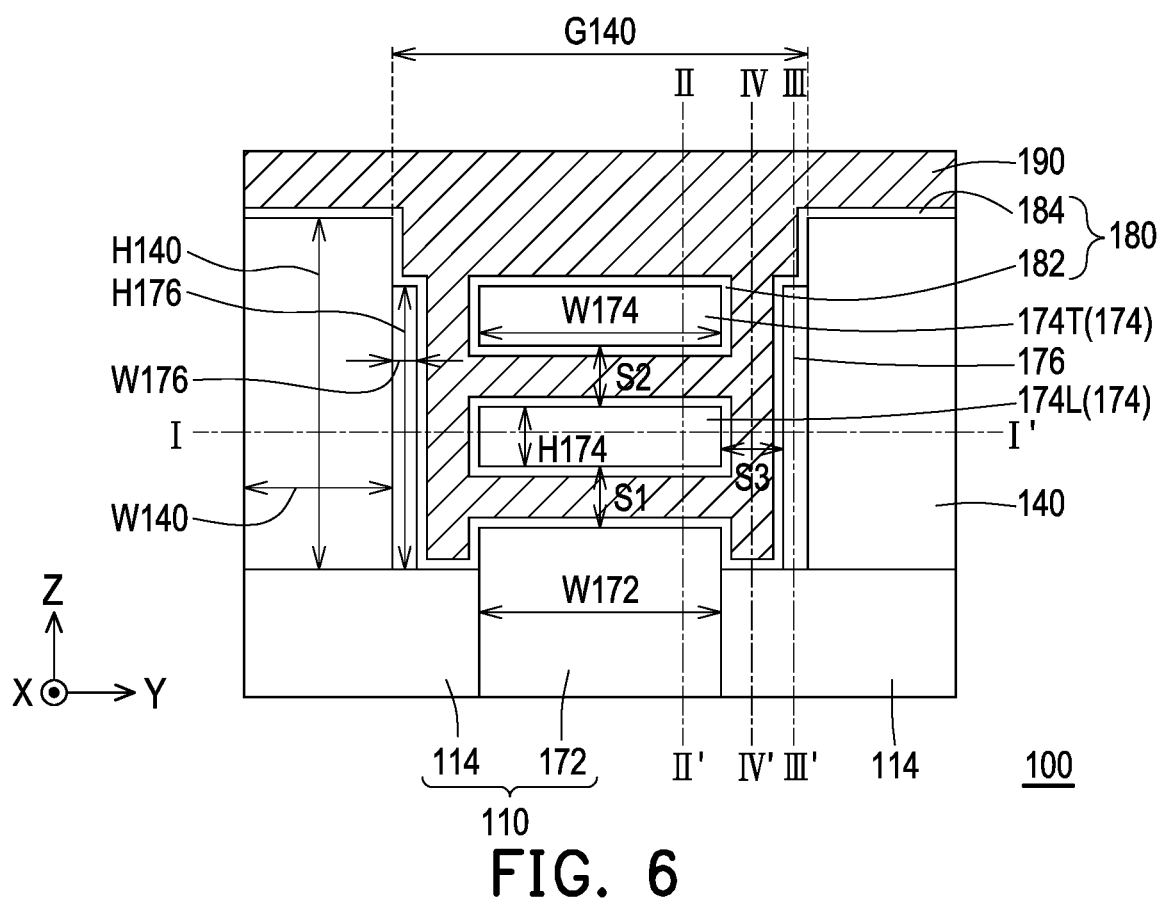

The step of forming PRG as shown in FIG. 6 includes forming a gate dielectric layer 180 and a gate electrode structure 190. In some embodiments, the gate dielectric layer 180 and the gate electrode structure 190 may be known as a replacement gate structure. The gate dielectric layer 180 may include a dielectric portion 182 surrounding exposed surfaces of the embedded channel structures 174, and a dielectric portion 184 continuously cover exposed surfaces of the dielectric fins 140, the sidewall channel structures 176, the isolation region 114, and the bottom channel structure 172 as shown in FIG. 5. In accordance with some embodiments, the gate dielectric layer 180 includes silicon oxide, silicon nitride, or multilayers thereof. In some embodiments, the gate dielectric layer 180 is a high-k dielectric material, and in these embodiments, the gate dielectric layer 180 may have a k value greater than about 7.0, and may include a metal oxide or a silicate of Hf, Al, Zr, La, Mg, Ba, Ti, Pb, and combinations thereof. The formation methods of the gate dielectric layer 170 may include Molecular-Beam Deposition (MBD), ALD, PECVD, and the like.

The gate electrode structure 190 fills the space between the dielectric fins 140. Specifically, the gate electrode structure 190 is disposed between the lowest embedded channel structure 174L and the bottom channel structure 172, between the lowest embedded channel structure 174L and the adjacent embedded channel structure 174, and between the embedded channel structures 174 and the sidewall channel structures 176. In addition, the gate electrode structure 190 covers a portion of the dielectric layer 174 over the dielectric fin 140. The gate electrode structure 190 may be a metal-containing material such as TiN, TiO, TaN, TaC, Co, Ru, Al, W, combinations thereof, or multi-layers thereof. The gate electrode structure 190 may have a multi-layered structure, and may comprise any number of liner layers, any number of work function layers, and a fill material that are stacked sequentially.

In FIG. 6, a semiconductor device 100 includes dielectric fins 140, a bottom channel structure 172, embedded channel structures 174, sidewall channel structures 176, a gate dielectric layer 180, and a gate electrode structure 190. The bottom channel structure 172 may be a protruded structure of the substrate 110 and the substrate 110 may further have an isolation structure 114 disposed beside the bottom channel structure 172 and substantially located at opposites of the bottom channel structure 172 in the direction of the Y-axis. The embedded channel structures 174 may be located above the bottom channel structure 172 and separated from the bottom channel structure 172 in the direction of Z-axis. The sidewall channel structures 176 are disposed on the sidewall of the dielectric fins 140. The gate dielectric layer 180 covers and is in contact with the bottom channel structure 172, the embedded channel structures 174, and the sidewall channel structures 176. The gate electrode structure 190 is disposed on the gate dielectric layer 180 and fill the space between two structures of the bottom channel structure 172, the embedded channel structures 174, and the sidewall channel structures 176. In some embodiments, the gate dielectric layer 180 is disposed between the gate electrode structure 190 and the bottom channel structures 172, between the gate electrode structure 190 and the embedded channel structures 174, and between the gate electrode structure 190 and the sidewall channel structures 176.

As described in above, the substrate 110 has a semiconductor material and the bottom channel structure 172 is a protruded structure formed by a portion of the semiconductor material of the substrate 110. In other words, the bottom channel structure 172 is formed in the substrate 110 and the isolation structure 114 laterally surrounds the bottom channel structure 172. The isolation structure 114 may be an oxide that is deposited in the recess for defining the protruded structure of the bottom channel structure 172 (e.g. the semiconductor strip 112 shown in FIG. 1). The bottom channel structure 172 may be higher than the isolation structure 114 and protruded from the isolation structure 114 in the direction of Z-axis.

The embedded channel structures 174 may be disposed over the bottom channel structure 172 that is formed in the substrate 110 and the gate electrode structure 190 is disposed all around the embedded channel structures 174 so that the embedded channel structures 174 may be considered "embedded". The embedded channel structures 174 may be aligned with the bottom channel structure 172 in the Z-axis. In some embodiments, the width W174 of the embedded channel structures 174 may be substantially identical to the width W172 of the bottom channel structure 172 in Y-axis. In some embodiments, the side surfaces of the embedded channel structures 174 and the side surface of the bottom channel structure 172 may extend on the same X-Z plane.

The width W174 of the embedded channel structures 174 may be greater than the height H174 of the embedded channel structures 174. The embedded channel structures 174 may be sheet-like structures extending in X-axis. In some embodiments, the width W174 of the embedded channel structures 174 may be similar to the height H174 of the embedded channel structures 174 and have wire-like structures extending in X-axis. In some embodiments, the embedded channel structures 174 may have a rectangular shape in the cross section while in alternative embodiments, the embedded channel structures 174 may have a circular or oval shape in the cross section, but the disclosure is not limited thereto.

Two embedded channel structures 174 are presented in FIG. 6 for descriptive purpose. In some embodiments, the quantity of the embedded channel structures 174 is determined based on the product requirement. For example, 1 to 5 embedded channel structures 174 may be formed in the semiconductor device 100. The lower embedded channel structure 174L is separated from the bottom channel structure 172 of the substrate 110 by a distance Si in the Z-axis, and the adjacent embedded channel structures 174 are separated from each other by a distance S2 in the Z-axis. In some embodiments, the distance Si and the distance S2 may be the same and may be determined according to the thickness of the above mentioned first epitaxial layers 122 that was removed during fabricating the semiconductor device 100. The embedded channel structures 174 are made of semiconductor material such as silicon, but not limited thereto.

The sidewall channel structures 176 may be wall-like structures disposed on the isolation structure 114 of the substrate 110 and located at a lateral side of the embedded channel structures 174 in the Y-axis. The sidewall channel structure 176 is disposed between the gate dielectric layer 180 and the dielectric fin 140. The sidewall channel structures 176 are directly disposed on and in contact with the sidewall of the dielectric fins 140. The sidewall channel structure 176 may have an elongate shape extending in Z-axis in the cross section of FIG. 6. In some embodiments, the width W176 of the sidewall channel structure 176 may be 1 nanometer to 5 nanometers and the height H176 of the sidewall channel structure 176 may be 15 nanometers to 60 nanometers. The sidewall channel structure 176 may also extend in X-axis to form a wall-like structure along the sidewall of the dielectric fins 140.

The sidewall channel structures 176 are disposed on the isolation layer 114, located at opposite sides of the embedded channel structures 174 in Y-axis and separated from the embedded channel structures 174 by a distance S3. Therefore, the bottom channel structure 172, the embedded channel structures 174 and the sidewall channel structures 176 are separate channel structures. In some embodiments, the distance S3 may be determined based on the thickness of the above mentioned first cap layer 132 that was removed during fabricating the semiconductor device 100. The sidewall channel structures 176 are patterned from sidewall portions of the second cap layer 134 in FIG. 1 and the sidewall portion of the second cap layer 134 in FIG. 1 may be laterally grown from the sidewall portion of the first cap layer 132 in FIG. 1. In some embodiments, the crystal orientation of the sidewall channel structures 176 may be different from the crystal orientation of the embedded channel structure 174 since the embedded channel structure 174 is formed from the second epitaxial layer 124 in FIG. 1 that is vertically grown from the first epitaxial layer 122 in FIG. 1.

The dielectric fins 140 are disposed on the isolation structure 114 of the substrate 110 and separated by a gap G140. The embedded channel structures 174 and the sidewall channel structures 176 are disposed within the gap G140. The sidewall channel structures 176 extends along and physically contact the sidewall of the dielectric fins 140. The height H140 of the dielectric fin 140 may be higher than the height H176 of the sidewall channel structure 176. In some embodiments, the height H140 of the dielectric fins 140 may be 20 nanometers to 65 nanometers and the width W140 of the dielectric fins 140 may be 3 nanometers to 50 nanometers, but the disclosure is not limited thereto. In addition, the top of the top most embedded channel structure 174T may be leveled to the tops of the sidewall channel structures 176 while the tops of the dielectric fins 140 are leveled higher than the top most embedded channel structure 174T and the sidewall channel structures 176. The dielectric fins 140 are made of a low-K dielectric material such as $SiO_2$, SiN, SiCN, or SiOCN.

The gate dielectric layer 180 includes a dielectric portion 182 and a dielectric portion 184. The dielectric portion 182 and the dielectric layer 184 are made of a high-k dielectric material and may include a metal oxide or a silicate of Hf, Al, Zr, La, Mg, Ba, Ti, Pb, and combinations thereof. The dielectric portion 182 is disposed on the embedded channel structures 174 and substantially wraps the embedded channel structures 174 to form a ring-like pattern in the cross section of FIG. 6. The dielectric portion 184 is disposed on the bottom channel structure 172 and the sidewall channel structures 176. Specifically, the dielectric portion 184 may be conformally disposed on and cover the bottom channel structure 172, the sidewall channel structures 176, a portion of the isolation structure 114 between the bottom channel structure 172 and the sidewall channel structures 176, and the dielectric fin 140. Accordingly, the bottom channel structure 172, the embedded channel structure 174 and the sidewall channel structure 176 are covered by the gate dielectric layer 180.

The gate electrode structure 190 at least fills the space between the dielectric portion 182 and the dielectric portion 184. Specifically, the gate electrode structure 190 encircles the embedded channel structures 174 and is located between the embedded channel structures 174 and the sidewall channel structures 176. The gate electrode structure 190 includes metal-containing material such as TiN, TiO, TaN, TaC, Co, Ru, Al, W, combinations thereof, or multi-layers thereof. The gate electrode structure 190 may have a multi-layered structure, and may comprise any number of liner layers, any number of work function layers, and a fill material that are stacked sequentially. In addition, the gate electrode structure 190 is isolated from the bottom channel structure 172, the embedded channel structures 174 and the sidewall channel structures 176 by the gate dielectric layer 180. In addition, the gate electrode structure 190 may have a sufficient thickness in the X-axis so as to contact to other components for signal transmission. In other words, the top of the gate electrode structure 190 may be higher than the gate dielectric layer 180 in Z-axis.

The electric signal applied to the gate electrode structure 190 enables or disables the bottom channel structure 172, the embedded channel structures 174 and the sidewall channel structures 176 so as to achieve the switch of the semiconductor device 100. In other words, the voltage value on the gate electrode structure 190 may change the carrier mobility of the bottom channel structure 172, the embedded channel structures 174 and the sidewall channel structures 176 to present turn-on or turn-off status. The bottom channel structure 172, the embedded channel structures 174 and the sidewall channel structures 176 all serve as the switchable channels of the semiconductor device 100. The channel size of the semiconductor device 100 may be increased by disposing the bottom channel structure 172, the embedded channel structures 174 and the sidewall channel structures 176, the embedded channel structures 174 and the sidewall channel structures 176. The semiconductor device 100 having increased channel size allows to provide more driving current to achieve higher performance. In addition, the sidewall channel structures 176 are thin wall-like structures that occupies a limited volume so that the semiconductor device 100 is still compact in physical size and is able to be arranged in high density in the product. Therefore, the semiconductor device 100 has a larger channel while remains a small volume.

In some embodiments, the embedded channel structures 174 and the sidewall channel structures 176 are formed from the second epitaxial layer 124 and the second cap layer 134 in FIG. 1. The second epitaxial layer 124 for forming the embedded channel structures 174 and the second cap layer 134 for forming the sidewall channel structures 176 may be grown in different directions, for example, the vertical direction and the lateral direction. In some embodiments, the second epitaxial layer 124 for forming the embedded channel structures 174 grown in the vertical direction may have a crystal orientation of (100) and the second cap layer 134 for forming the sidewall channel structures 176 grown in the lateral direction may have a crystal orientation of (110). Therefore, the embedded channel structures 174 and the sidewall channel structures 176 may provide different properties for different carrier. In some embodiments, the sidewall channel structures 176 having the crystal orientation of (110) may further enhance the carrier mobility for a P-type carrier. Therefore, in the case the semiconductor device 100 is a P-type device, the carrier mobility may be further enhanced.

FIG. 7 to FIG. 12 schematically illustrate a method of fabricating a semiconductor device from a plane view in accordance with some embodiments of the disclosure. Referring to the X-axis, the Y-axis and the Z-axis, FIG. 7 to FIG. 12 depict the plane views of the structures cut along line I-I' of FIG. 6 under respective steps. The same reference numbers in the embodiment of FIG. 1 to FIG. 6 and the embodiment of FIG. 7 to FIG. 12 may present the same elements or their alternatives and the descriptions for these elements in different embodiments may be applicable to each other.

Figure 7:
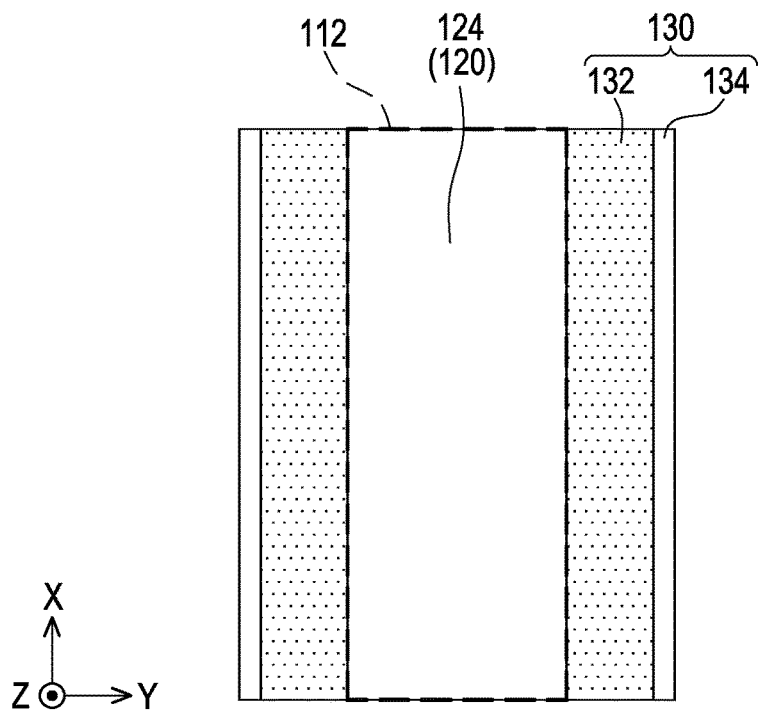
FIG. 7 to FIG. 12 schematically illustrate a method of fabricating a semiconductor device from a plane view in accordance with some embodiments of the disclosure.

FIG. 7 shows the second epitaxial layer 124 is disposed between two portions of the first cap layer 132 and the two portions of the first cap layer 132 are disposed between two portions of the second cap layer 134. In addition, the first cap layer 132 and the second cap layer 134 construe the epitaxial cap 130 as shown in FIG. 1 and the second epitaxial layer 124 is one layer of the epitaxial stack 120 as shown in FIG. 1. Specifically, FIG. 7 may present the plane view of the structure under the step of FIG. 1. The epitaxial stack 120 may be corresponding to the semiconductor strip 112 located at a level lower than the line I-I' of FIG. 6 and thus the semiconductor strip 112 is presented by dash line in FIG. 7. In some embodiments, the portions of the first cap layer 132 in FIG. 7 may be laterally grown on the side wall of the epitaxial stack 120 and the portions of the second cap layer 134 may be laterally grown on the sidewall of the first cap layer 132. The material of the first cap layer 132 may be silicon germanium and the material of the second cap layer 134 may be silicon. The material of the second epitaxial layer 124 may be the same as the material of the second cap layer 134. The second epitaxial layer 124, the first cap layer 130, and the second cap layer 134 may extend in X-axis.

Figure 8:
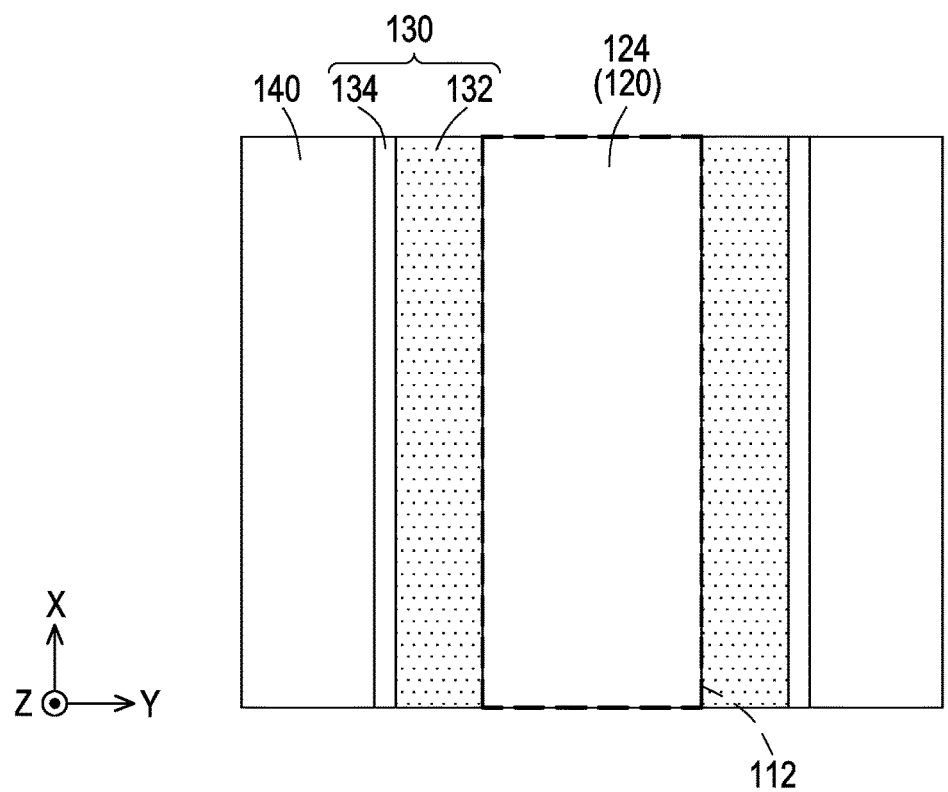

In FIG. 8, the dielectric fins 140 are formed beside the epitaxial cap 130 and at two opposite sides of the epitaxial stack 124 in the Y-axis. The dielectric fins 140 are made of a low-K dielectric material and may include $SiO_2$, SiN, SiCN, or SiOCN. The first cap layer 132, the second cap layer 134 and the dielectric fins 140 are disposed beside the second epitaxial layer 124 and sequentially arranged away from the second epitaxial layer 124 in a lateral direction in Y-axis. In some embodiments, FIG. 8 may present the plane view of the structure under the step of FIG. 2 and the step of FIG. 3.

Figure 9:
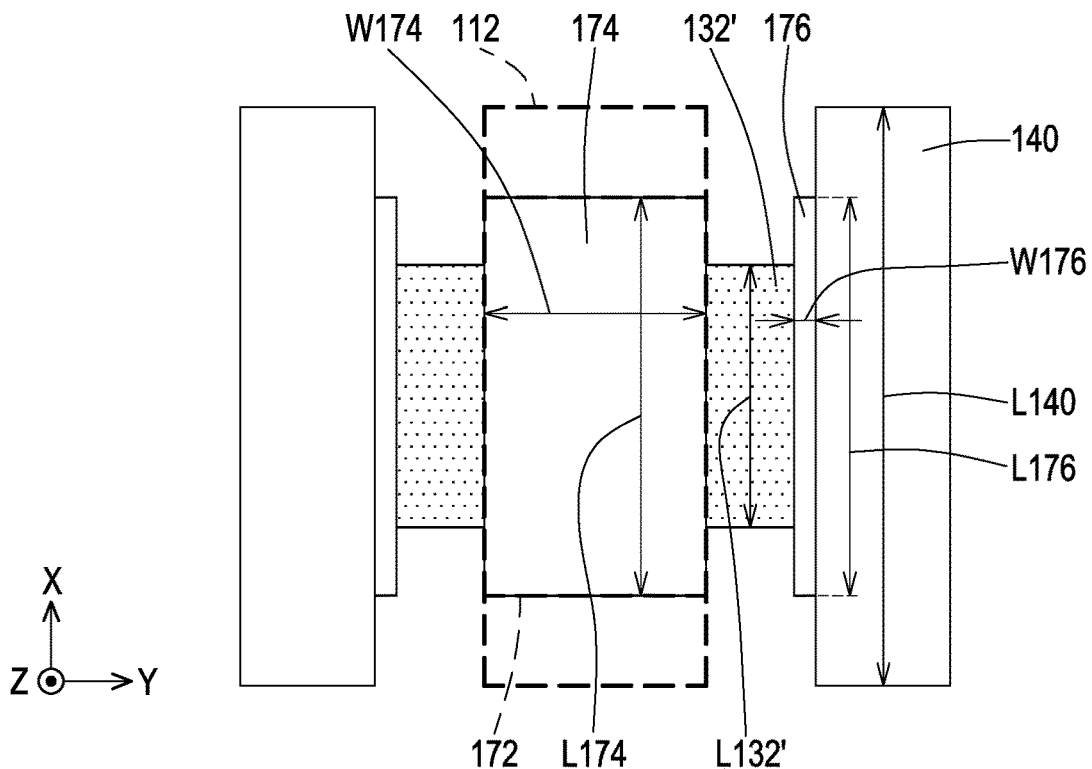

In FIG. 9, the step of forming the channel structure is performed and the step of FIG. 9 may be included in the step of FIG. 4. The embedded channel structures 174 and the sidewall channel structures 176 are formed by patterning the epitaxial stack 120 and the epitaxial cap 130 in FIG. 1. Specifically, as shown in FIG. 9, the second epitaxial layer 124 is patterned to the embedded channel structure 174, the first cap layer 132 is patterned to form a shrunk first cap layer 132', and the second cap layer 134 is patterned to the sidewall channel structure 176. In addition, a portion of the semiconductor strip 112 is patterned to form the bottom channel structure 172. In FIG. 9, a selective removal process may be performed so that the first cap layer 132 is patterned to the shrunk first cap layer 132' that is shrunk relative to the embedded channel structure 174 and the sidewall channel structure 176.

As shown in FIG. 9, measured along the X-axis, the length L140 of the dielectric fins 140 is greater than the length L176 of the sidewall channel structure 176, the length L176 of the sidewall channel structure 176 is greater than the length L132' of the shrunk first cap layer 132', and the length L174 of the embedded channel structure 174 is greater than the length L132' of the shrunk first cap layer 132'. In some embodiments, the length L176 of the sidewall channel structure 176 may be substantially the same as the length L174 of the embedded channel structure 174 so as the bottom channel structure 172. In addition, the width W174 of the embedded channel structure 174 is smaller than the length L174 of the embedded channel structure 174 and the width W176 of the sidewall channel structure 176 is smaller than the length L176 of the sidewall channel structure 176, but the disclosure is not limited thereto.

Figure 10:
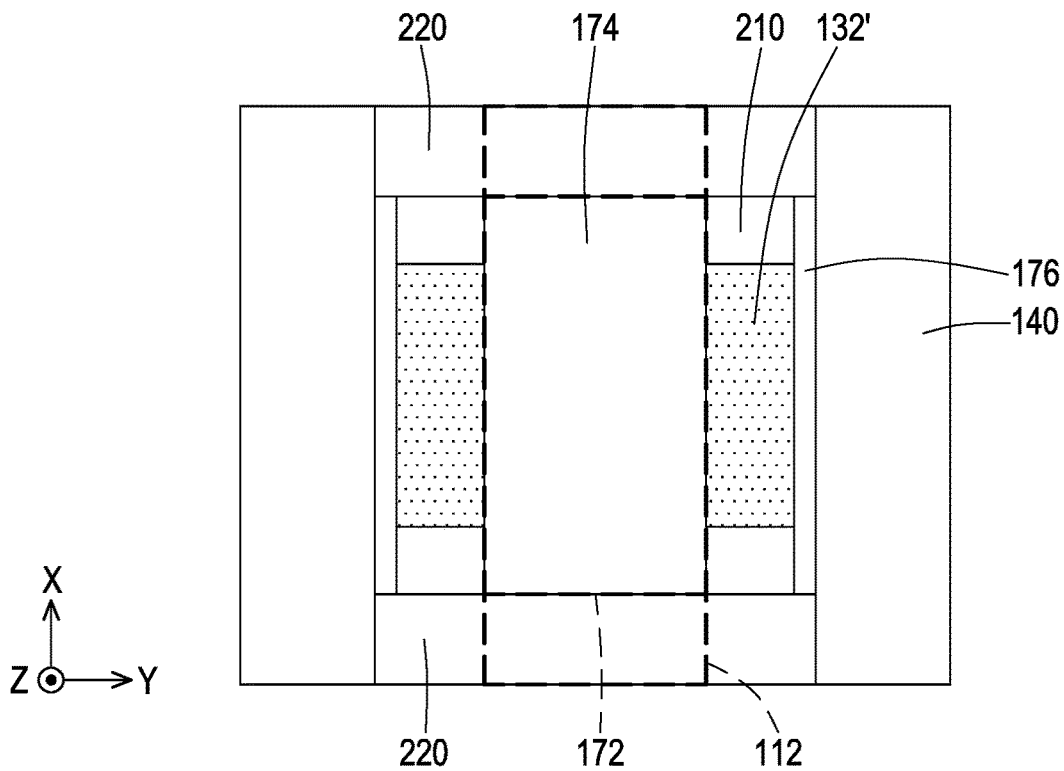

In FIG. 10, the step of forming a spacer structure and the step of forming source/drain structures are performed. Specifically, inner spacers 210 may be formed to fill the space left by the removal (e.g., recess formed by the shrunk first cap layer 132') of the first cap layer 132 discussed above with reference to FIG. 9. The inner spacers 210 may be a low-K dielectric material, such as $SiO_2$, SiN, SiCN, or SiOCN, and may be formed by a suitable deposition method, such as ALD. The inner spacers 210 are formed to fill the recess structure of the shrunk first cap layer 132' without covering the embedded channel structure 174 and the sidewall channel structure 176. Therefore, the side surfaces of the inner spacer 210, the embedded channel structure 174 and the sidewall channel structure 176 may be aligned as shown in FIG. 10.

In FIG. 10, source/drain structures 220 are formed at lateral sides of the embedded channel structure 174 and the sidewall channel structures 176 in X-axis. The source/drain structures 220 may be formed by epitaxially growing a material over the semiconductor strip 112, the bottom channel structure 172, the embedded channel structures 174 and the sidewall channel structures 176, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The semiconductor strip 112 is located at a level lower than the line I-I' of FIG. 6 and thus is presented by dash line in FIG. 10. The source/drain structures 220 may be formed between the dielectric fins 140 and located at opposite sides of the channel structure construed by the embedded channel structure 174 and the sidewall channels 176 in X-axis. In addition, the inner spacer 210 is disposed between the shrunk first cap layer 132' and the source/drain structures 220. The material(s) of the source/drain structures 220 may be tuned in accordance with the type of devices to be formed. In some embodiments, the resulting semiconductor device is an n-type FinFET, and the source/drain structures 220 include silicon carbide (SiC), silicon phosphorous (SiP), phosphorous-doped silicon carbon (SiCP), or the like. In some embodiments, the resulting semiconductor device is a p-type FinFET, and the source/drain structures 220 include SiGe, and a p-type impurity such as boron or indium.

Figure 11:
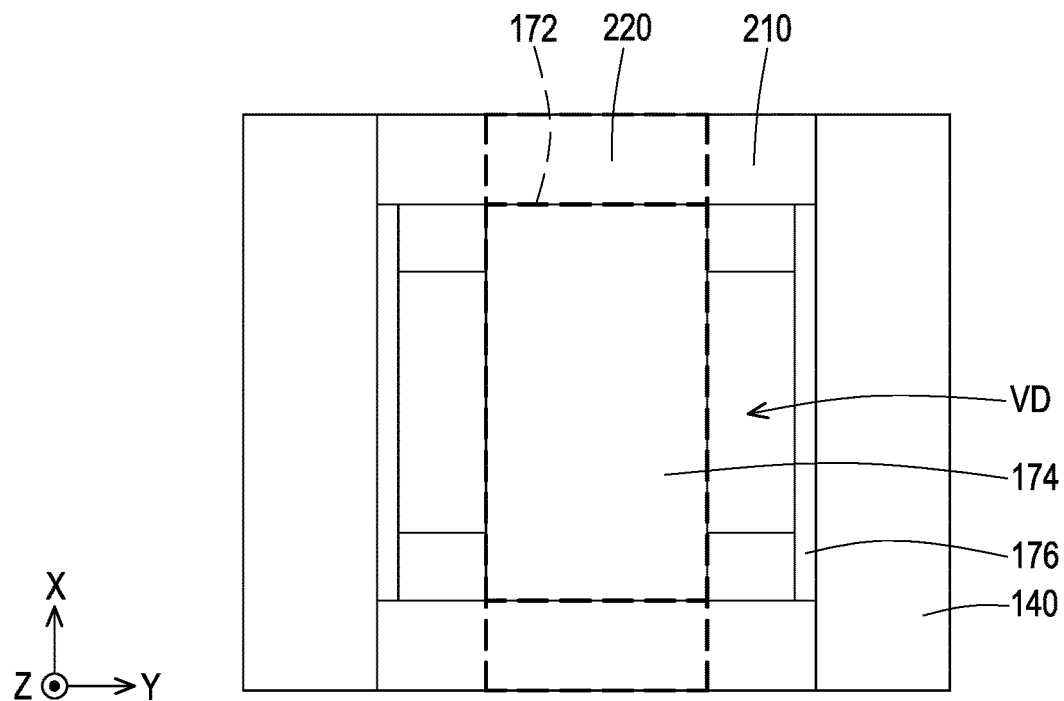

Thereafter, the shrunk first cap layer 132' are removed to obtain the structure shown in FIG. 11. In some embodiments, referring to FIG. 4 and FIG. 5, the dummy gate structure 160 on the first cap layer 132 may be removed in advance to reveal the top surface of the shrunk first cap layer 132' and then a selective removal process may be performed to remove the shrunk first cap layer 132' without removing the embedded channel structure 174. Accordingly, as shown in FIG. 5 and FIG. 11, the bottom channel structure 172, the embedded channel structure 174 and the sidewall channel structure 176 are separated from each other and exposed by the gap VD. The bottom channel structure 172, the embedded channel structure 174 and the sidewall channel structure 176 may be connected to each other through the source/drain structures 220. The source/drain structures 220 are not revealed by the gap VD of removing the shrunk first cap layer 132' since the shrunk first cap layer 132' is isolated from the source/drain structures 220 by the inner spacer 210 as shown in FIG. 10.

Figure 12:
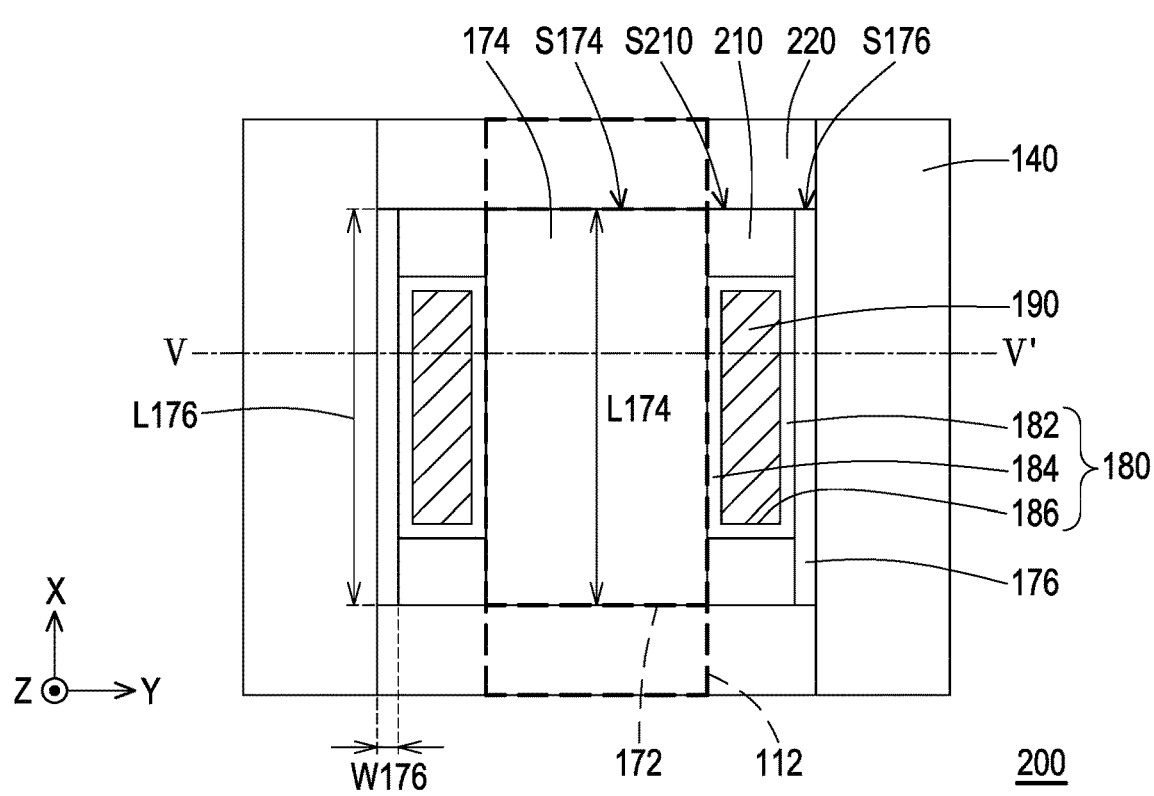

In FIG. 12, the step of forming replacement gate is performed. Specifically, the gate dielectric structure 180 and the gate electrode structure 190 are formed in sequence in the gap VD between bottom channel structure 172, the embedded channel structure 174 and the sidewall channel structure 176. The gate dielectric structure 180 may include the dielectric portion 182 covering and contacting the sidewall channel structure 174, the dielectric portion 184 covering and contacting the embedded channel structure 174 and the dielectric portion 186 between the dielectric portion 182 and the dielectric portion 184. The dielectric portion 186 may cover the inner spacer 210. Accordingly, the gate dielectric structure 180 is a continuous layer covering the bottom channel structure 172, the embedded channel structure 174, the sidewall channel structure 176 and the inner spacer 210 and forms a ring-like pattern in the plane view of FIG. 12.

The gate electrode structure 190 is formed on the gate dielectric structure 180 so that the gate electrode structure 190 is isolated from the bottom channel structure 172, the embedded channel structure 174 and the sidewall channel structure 176 by the gate dielectric structure 180. The material and the manufacturing method of the gate electrode structure 190 may refer to the previous embodiment and is not reiterated here.

In FIG. 12, a semiconductor device 200 may have the plane view structure including the embedded channel structure 174, the sidewall channel structure 176, the dielectric fins 140, the inner spacer 210, the source/drain structures 220, the gate dielectric structure 180 and the gate electrode structure 190. The source/drain structures 220 are disposed at opposite sides of the embedded channel structure 174 and the third structures 176 in the X-axis. The gate electrode structure 190 is separated from the embedded channel structure 174 and the sidewall channel structures 176 by the gate dielectric layer 180 and separated from the source/drain structures 220 by the gate dielectric layer 180 and the inner spacer 210. For example, the gate electrode structure 190 is laterally surrounded by the inner spacer 210, the embedded channel structure 174 and the sidewall channel structure 176. The inner spacers 210 and the gate electrode structure 190 are disposed between the embedded channel structure 174 and the sidewall channel structure 176 in the Y-axis. In addition, the side surface S210 of the inner spacers 210, the side surface S174 of the embedded channel structure 174 and the side surface S176 of the sidewall channel structure 176 are co-planar and are in contact with the source/drain structure 220. In some embodiments, the cross section shown in FIG. 6 may be corresponding to the line V-V' in FIG. 12.

The semiconductor device 200 have various types of channel structures which facilitates to improve the design variety of the device. The length L174 of the embedded channel structure 174 may be equivalent to the length L176 of the sidewall channel structure 176, and the length L174 and the length L176 may be determined based on the required characteristic of the semiconductor device 200. The disposition of the sidewall channel structure 176 increases the channel size of the semiconductor device 200 without increase the dimension of the semiconductor device 200 in X-axis. In addition, the width W176 of the sidewall channel structure 176 may be small, e.g. 1 nanometer to 5 nanometers so that the disposition of the sidewall channel structures 176 would increase a small amount of the device size in Y-axis, which facilitates the application in a high device density product. In some embodiments, the embedded channel structure 174 and the sidewall channel structures 176 may be grown in different epitaxial direction so as to have different crystal orientations, which may further enhance the performance of specific type device. For example, the channel structure grown in the crystal orientation of (110) enhances the performance of P-type device.

FIG. 13 to FIG. 20 schematically illustrate a method of fabricating a semiconductor device from a cross section in accordance with some embodiments of the disclosure. Referring to the X-axis, the Y-axis and the Z-axis, FIG. 13 to FIG. 20 depict the cross sections of the structures cut along line II-II' of FIG. 6 under respective steps. The same reference numbers in the embodiment of FIG. 13 to FIG. 20 and the previous embodiments may present the same elements or their alternatives and the descriptions for these elements in different embodiments may be applicable to each other.

Figure 13:
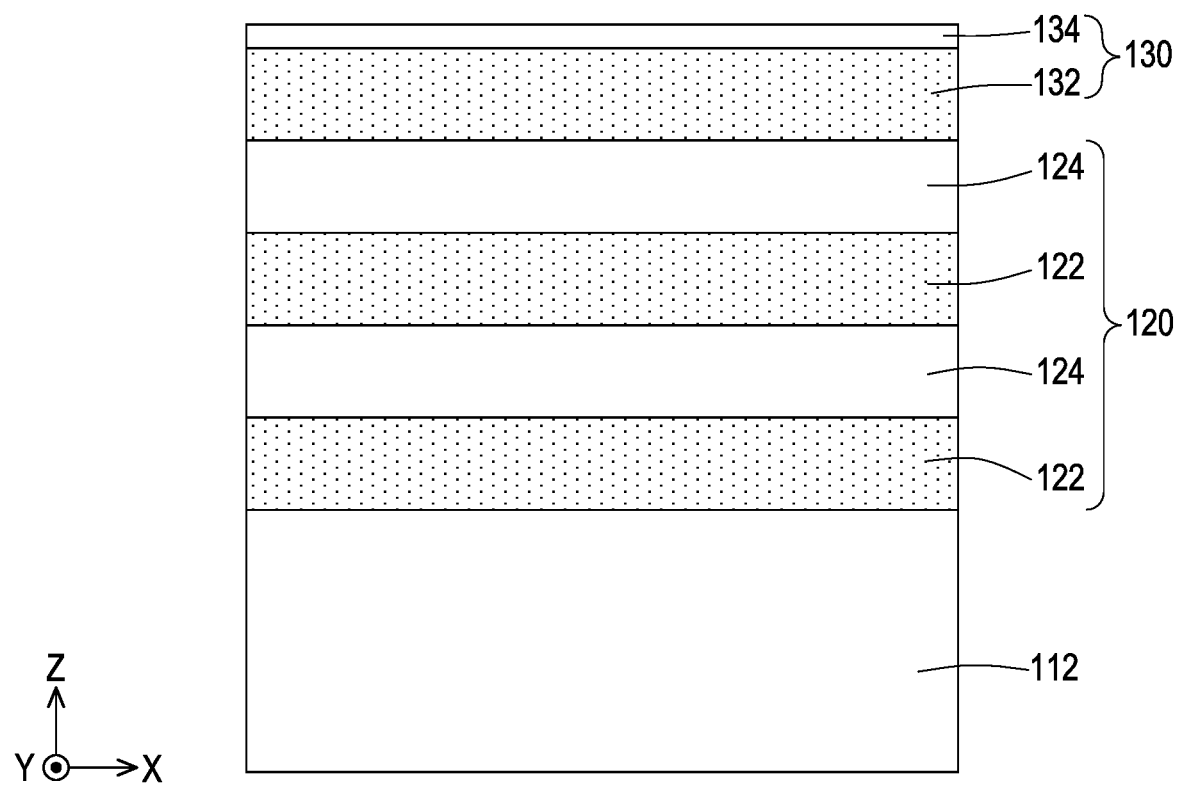
FIG. 13 to FIG. 20 schematically illustrate a method of fabricating a semiconductor device from a cross section in accordance with some embodiments of the disclosure.

In FIG. 13, the epitaxial stack 120 and the epitaxial cap 130 are formed on the semiconductor strip 112. The epitaxial stack 120 includes the first epitaxial layers 122 and the second epitaxial layers 124 stacked alternatively on the semiconductor strip 112. The epitaxial cap 130 includes the first cap layer 132 and the second cap layer 134 sequentially formed on the epitaxial stack 120. Similar to the previous embodiments, the first epitaxial layers 122 and the first cap layer 132 may be formed of a material different from the second epitaxial layer 124 and the second cap layer 134. For example, the material of the first epitaxial layers 122 and the first cap layer 132 may be silicon germanium and the material of the second epitaxial layers 124 and the second cap layer 134 may be silicon.

Figure 14:
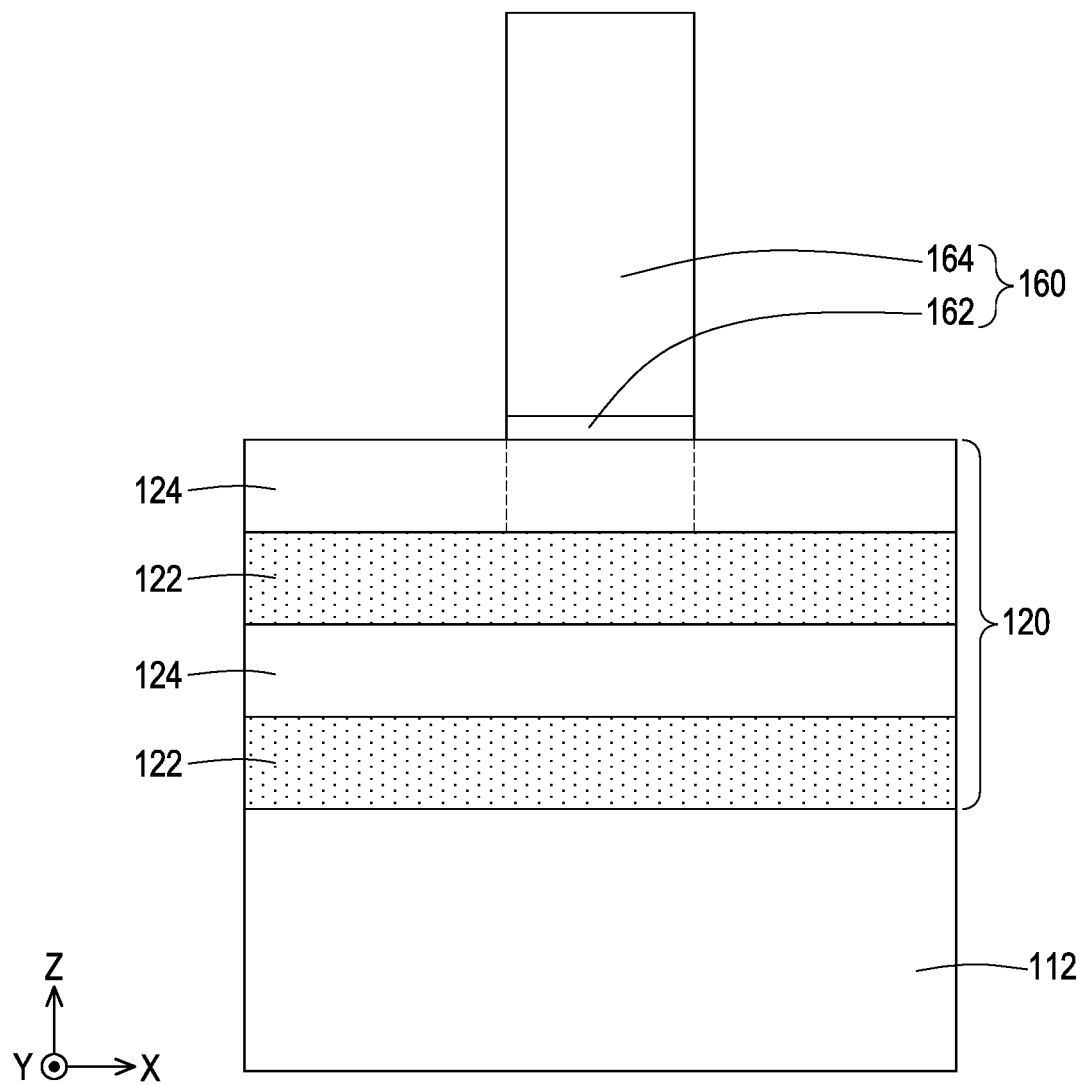

In FIG. 14, the epitaxial cap 130 above the epitaxial stack 120 is removed and the dummy gate structure 160 is formed on the epitaxial stack 120, which may be corresponding to the step of FIG. 3 and the step of FIG. 4. The dummy gate structure 160 may include a gate dielectric 162 and a dummy gate electrode 164. The gate dielectric 162 may be formed between the dummy gate electrode 164 and the epitaxial stack 120. In some embodiments, the dummy gate structure 160 is formed on the top most second epitaxial layer 124 of the epitaxial stack 120.

Figure 15:
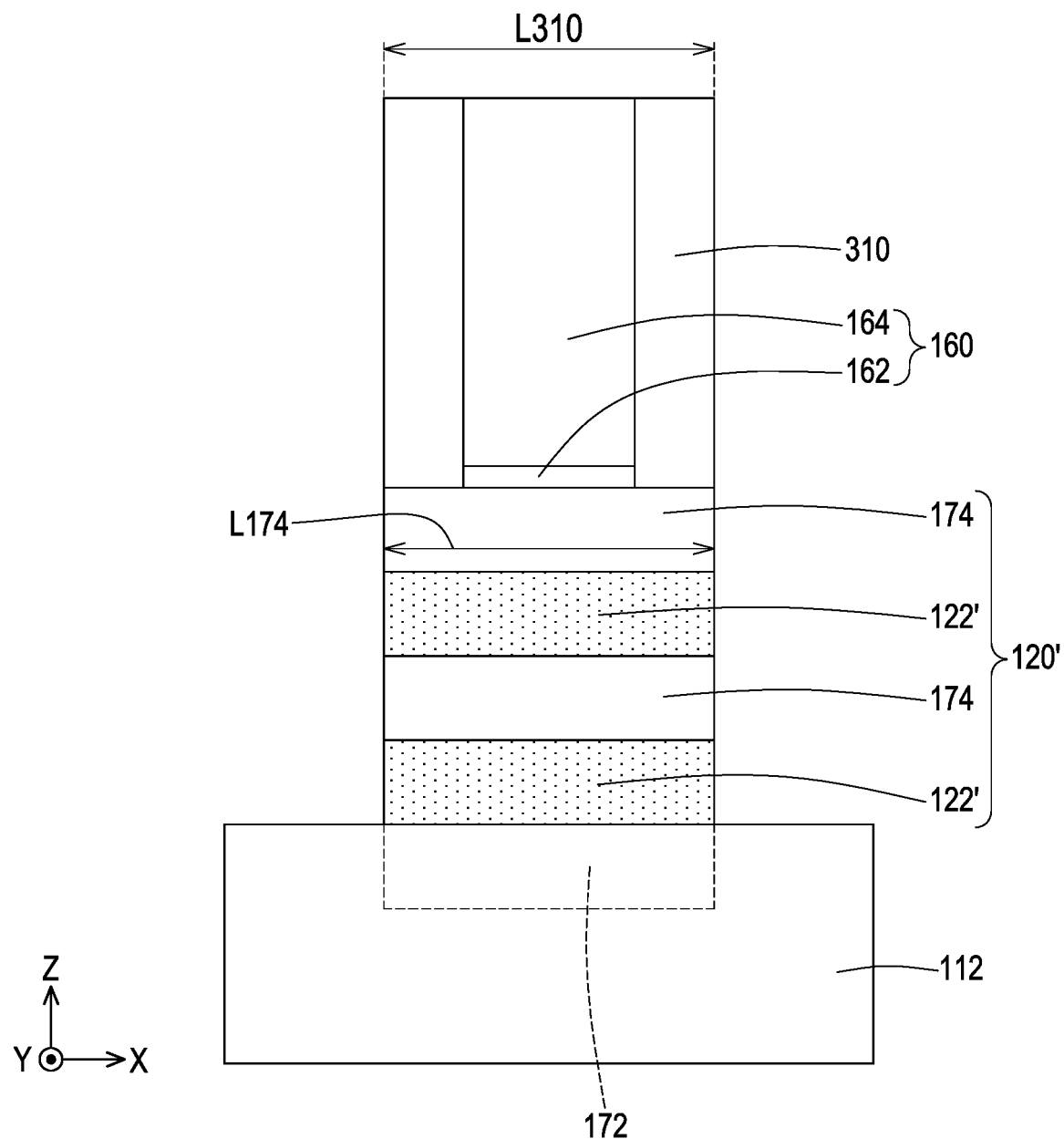

In FIG. 15, a spacer 310 is formed beside the dummy gate structure 160. In some embodiments, a spacer material layer (not shown) may be silicon nitride, silicon carbonitride, a combination thereof, or the like. In some embodiments, the spacer material layer includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer. The spacer material may be patterned by an anisotropic etching to form the spacer 310.

After forming the spacer 310, an anisotropic etching process is performed to form a shorten epitaxial stack 120' including the embedded channel structures 174 and the shorten first epitaxial layer 122'. Specifically, the embedded channel structures 174 from the second epitaxial layers 124 and form the shorten first epitaxial layers 122' from the first epitaxial layer 122. In addition, a portion of the semiconductor strip 112 under the shorten epitaxial stack 120' may be defined as the bottom channel structure 172. In some embodiments, the anisotropic etching process is a dry etch process (e.g., a plasma etch process). In some embodiments, the length L174 of the embedded channel structures 174 may be corresponding to the dimension L310 of the formed structure of the dummy gate structure 610 and the spacer 310. The sidewalls of the embedded channel structures 172 and the first epitaxial layers 122' may be aligned with the sidewall of the spacer 310.

Figure 16:
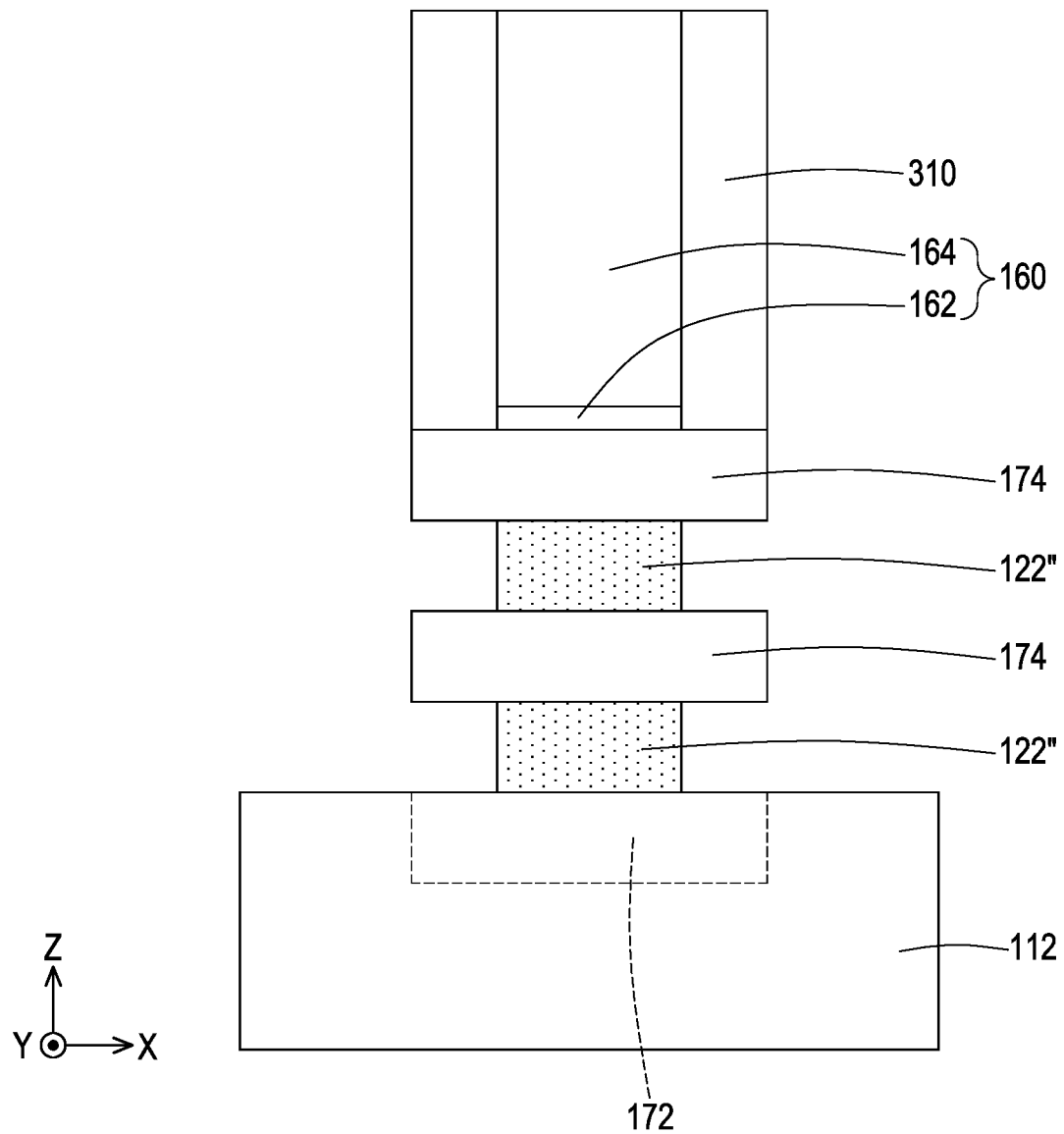

In FIG. 16, a lateral etching process is performed to recess exposed portions of the first semiconductor material of the shorten first epitaxial layers 122' using an etchant that is selective to the first semiconductor material while the second semiconductor material of the embedded channel structures 174 is not removed. Therefore, the shrunk first epitaxial layers 122" as well as the shrunk first cap layer 132' in FIG. 9 is formed and a recess structure is formed by the first epitaxial layers 122" and the embedded channel structures 174.

Figure 17:
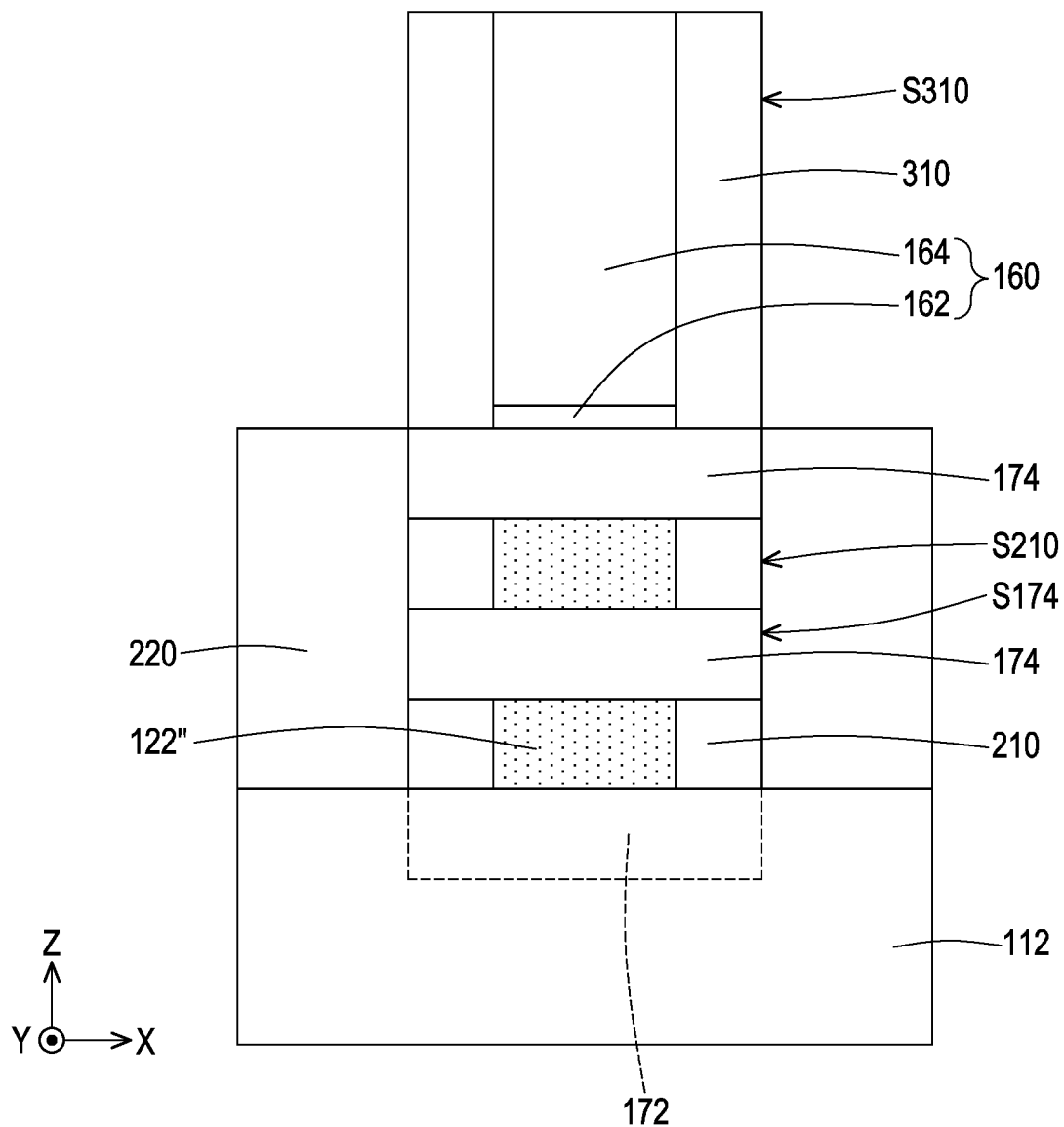
Figure 18:
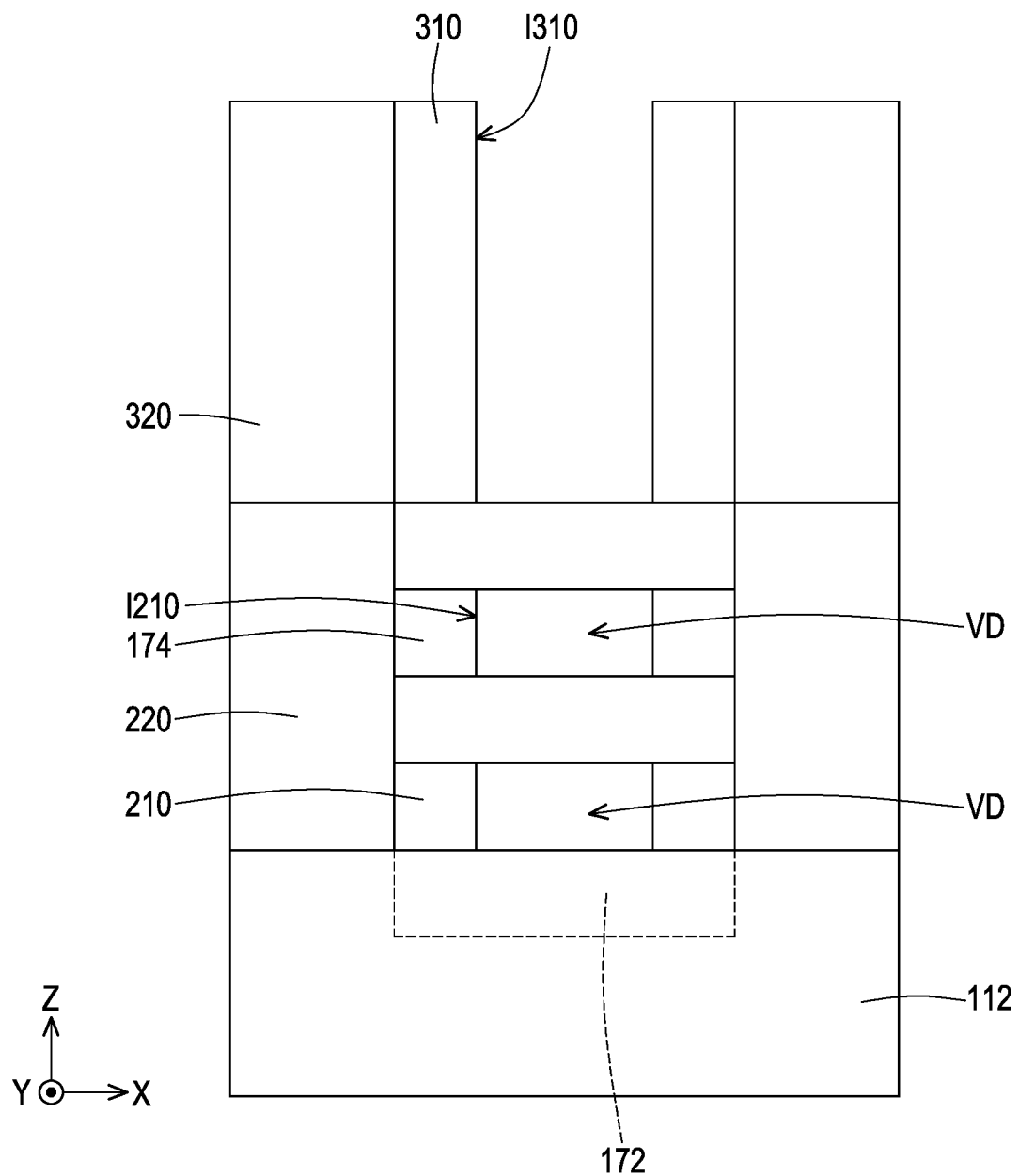

In FIG. 17, the inner spacer 210 and the source/drain structures 220 are formed, similar to the step of FIG. 10. In some embodiments, the steps of FIG. 14 to FIG. 17 may be corresponding to the step of FIG. 4 and may be references for the step of forming the spacer, the step forming the channel structure and the step of forming source/drain structures. The side surface S210 of the inner spacers 210, the side surface S174 of the embedded channel structure 174 and the side surface S310 of the spacer 310 may be coplanar. The source drain structures 220 are formed at two opposite lateral sides of the embedded channel structures 174 and in contact with the side surface S174 and the side surface S210. In FIG. 18, an interlayer dielectric (ILD) layer 320 may be formed on the source/drain structures 220 at the lateral side the spacers 310 in X-axis. The ILD layer 320 includes a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. In addition, a removal step similar to the step of FIG. 5 and the step of FIG. 11 is performed so that the shrunk first epitaxial layers 122" and the shrunk first cap layer 132' (shown in FIG. 10) are removed to provide the gap VD between the bottom channel structure 172, the embedded channel structures 174 and the sidewall channel structures 176 to expose the inner surfaces I310 of the spacer 310 and the inner surfaces I210 of the inner spacers 210. The gap VD between the embedded channel structures 174 shown in FIG. 18 may extend along the embedded channel structures 174 between the embedded channel structure 174 and the sidewall channel structure 176 in Y-axis and communicated with gap VD shown in FIG. 11.

Figure 19:
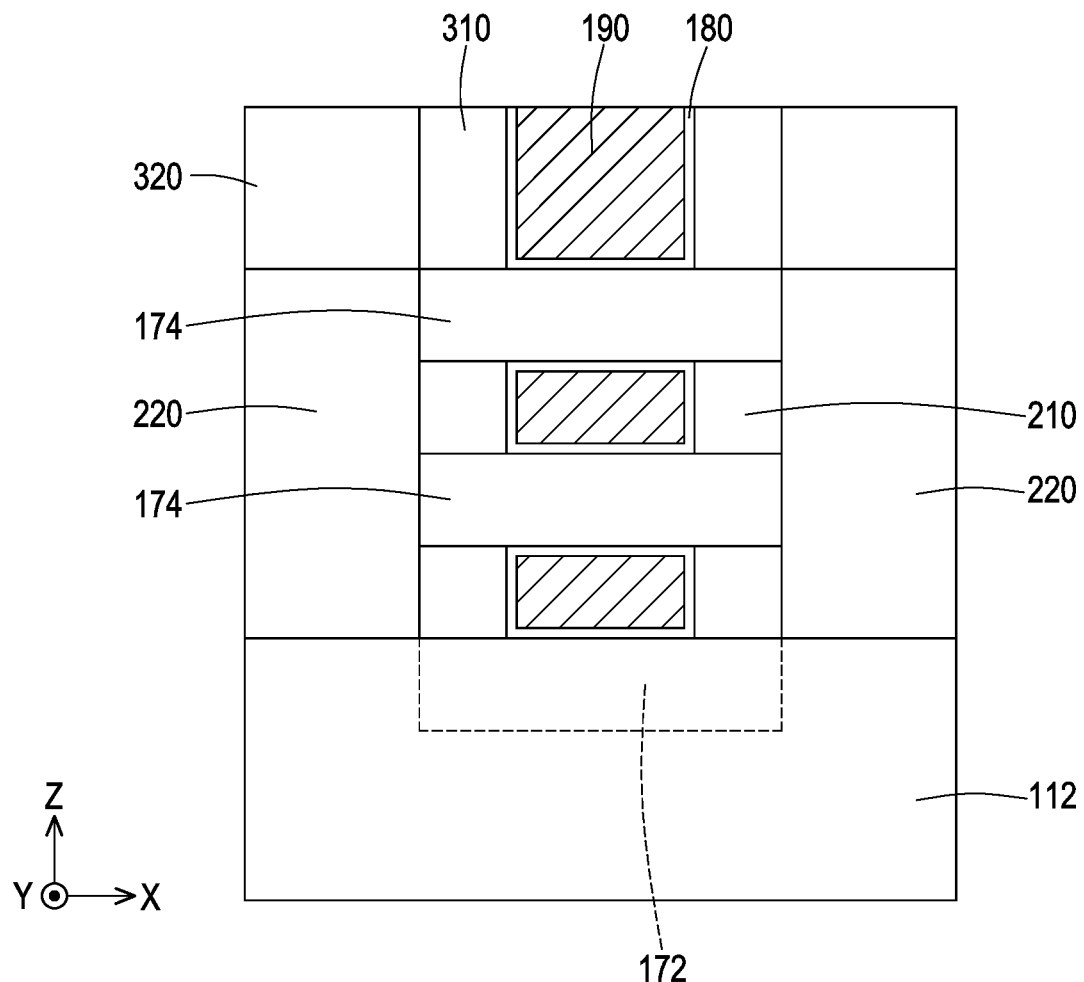
Figure 20:
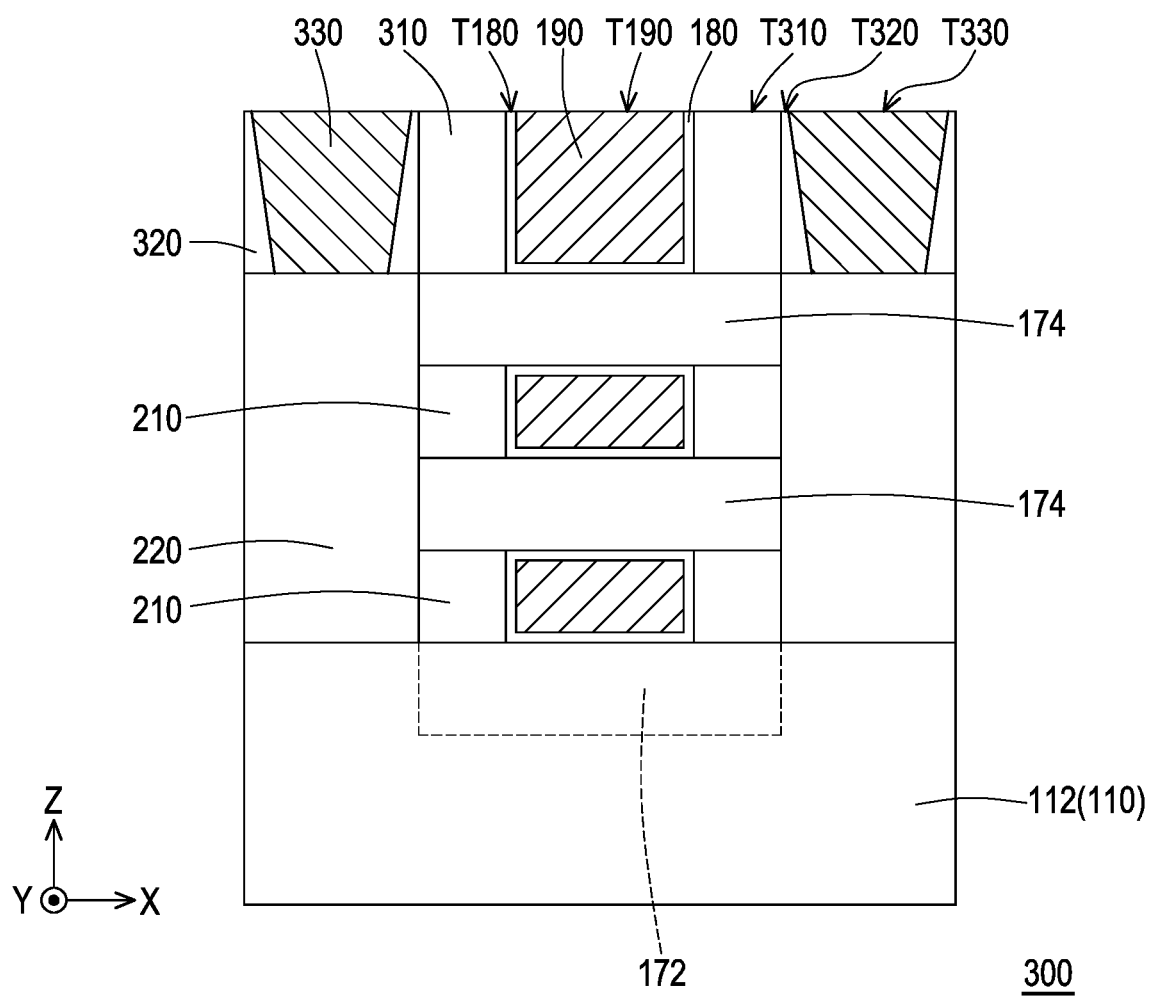

Subsequently, the step of forming the gate dielectric layer 180 and the gate electrode structure 190 similar to the step of FIG. 12 is performed as shown in FIG. 19. The gate dielectric layer 180 and the gate electrode structure 190 fill the gap VD between the spacer 310, the inner spacers 210, the bottom channel structure 172, the embedded channel structures 174 and the sidewall channel structures 176. The gate dielectric layer 180 separates the gate electrode structure 190 from the spacer 310, the inner spacers 210, the bottom channel structure 172, the embedded channel structures 174 and the sidewall channel structures 176. In FIG. 20, contact metals 330 may be formed in the ILD layer 320 and in contact with the source/drain structures 220. In some embodiments, a planarization process may be subsequentially performed so that the tops of the contact metals 330, the gate electrode structure 190, the gate dielectric layer 190 and the spacer 310 are substantially at the same level.

A semiconductor device 300 in FIG. 20 includes the bottom channel structure 172 formed in the semiconductor strip 112 of the substrate 110, the source/drain structures 220, the embedded channel structures 174 disposed between the source/drain structures 220, the gate dielectric layer 180, the gate electrode structures 190, the inner spacers 210 and the spacer 310 beside the gate electrode structure 190, the ILD layer 320 and the contact metals 330. The embedded channel structures 174 may have sheet-like structure extending along the X-axis and connecting to the source/drain structures 220 at the opposite sides in the X-axis. The inner spacers 210 and the gate electrode structure 190 are disposed between adjacent embedded channel structures 174 while the gate dielectric layer 180 is disposed between the gate electrode structure 190 and the embedded channel structure 174. The gate dielectric layer 180 is further disposed between the gate electrode structure 190 and the bottom channel structure 172, between the gate electrode structure 190 and the inner spacers 210, and between the gate electrode structure 190 and the spacers 310. The source/drain structures 220 are formed and disposed directly on the semiconductor strip 112 of the substrate 110. The ILD layer 320 is disposed on the source/drain structures 220 and the metal contacts 320 extend through the ILD layer 320 to contact the source/drain structures 220. A planarization process may be performed on the semiconductor device 300 so that the top surface T190 of the gate electrode structure 190, the top surface T180 of the gate dielectric layer 180, the top surface T310 of the spacer 310, the top surface T320 of the ILD layer 320 and the top surface T330 of the metal contact 330 are coplanar.

FIG. 21 to FIG. 27 schematically illustrate a method of fabricating a semiconductor device from a cross section in accordance with some embodiments of the disclosure. Referring to the X-axis, the Y-axis and the Z-axis, FIG. 21 to FIG. 27 depict the cross sections of the structures cut along line III-III' of FIG. 6 under respective steps. The same reference numbers in the embodiment of FIG. 21 to FIG. 27 and the previous embodiments of FIG. 1 to FIG. 20 may present the same elements or their alternatives and the descriptions for these elements in different embodiments may be applicable to each other.

Figure 21:
FIG. 21 to FIG. 27 schematically illustrate a method of fabricating a semiconductor device from a cross section in accordance with some embodiments of the disclosure.
Figure 22:
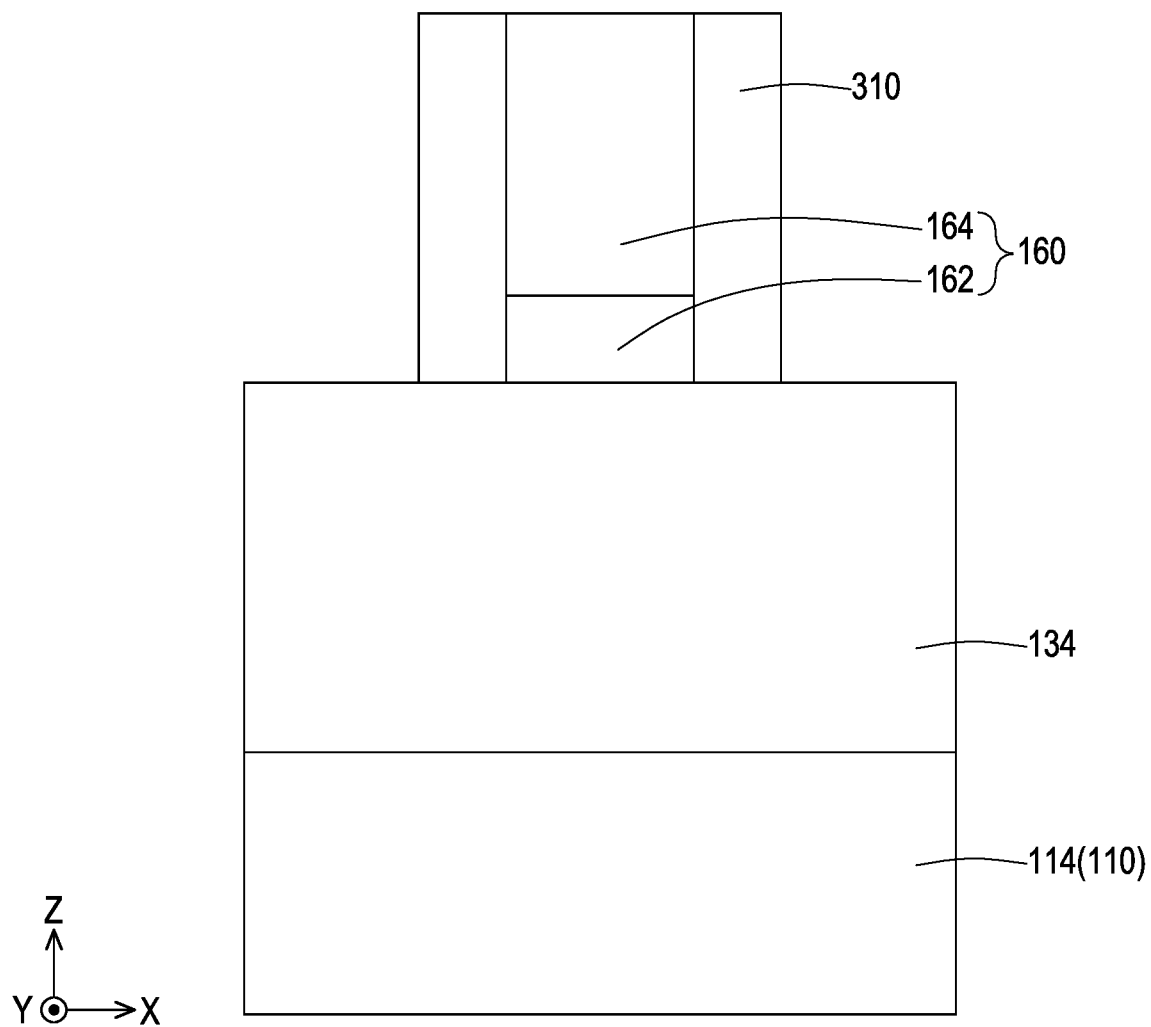

In FIG. 21, the second cap layer 134 is disposed on the isolation structure 114 of the substrate 110, which is similar to the steps of FIG. 1, FIG. 7 and FIG. 13 of the previous embodiments. The second cap layer 134 is formed on the isolation structure 114 using the epitaxial technique and is made of a semiconductor material such as silicon. In FIG. 22, the dummy gate structure 160 and the spacer 310 are disposed on the second cap layer 134. The dummy gate structure 160 may be formed by the method similar to that described in FIG. 4 and FIG. 14. The dummy gate structure 160 may include the gate dielectric 162 and the dummy gate electrode 164. The spacer 310 is formed beside the dummy gate structure 160 and disposed at opposite sides of the dummy gat structure 160 in the x-axis. The formation of the spacer 310 may relate to the description of FIG. 15.

Figure 23:
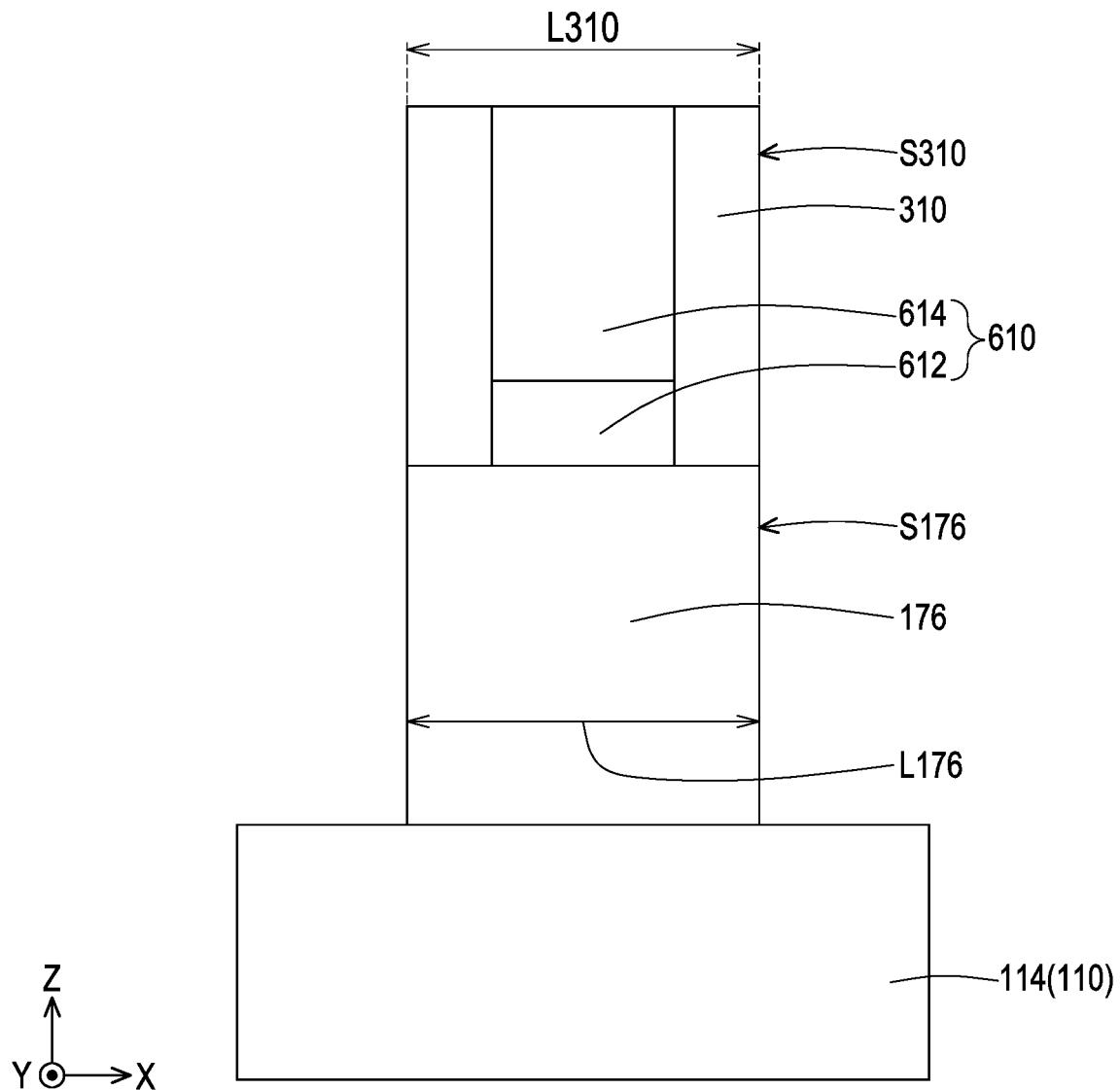
Figure 24:
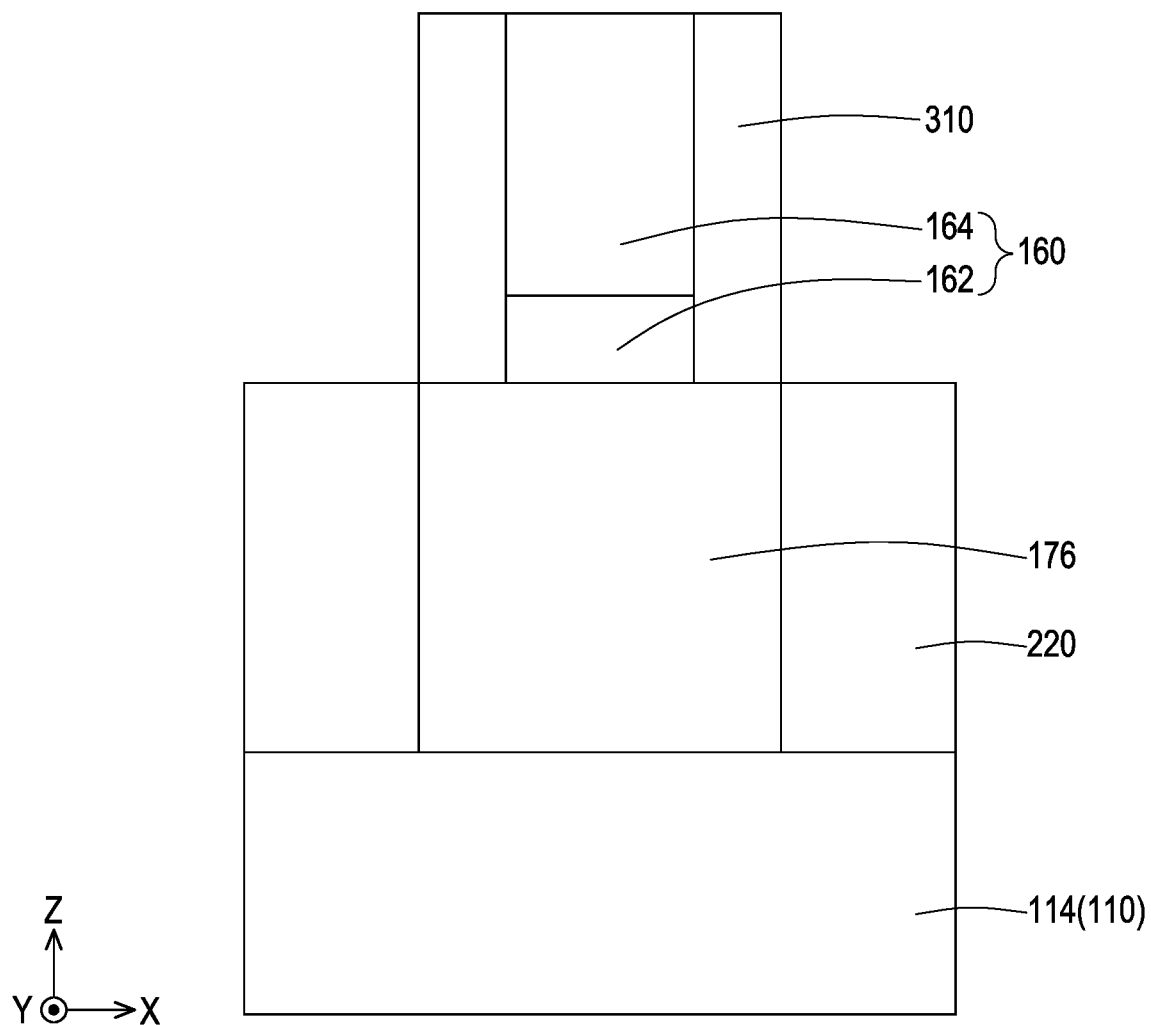

In FIG. 23, a patterning process is performed to form the sidewall channel structure 176 from the second cap layer 134 of FIG. 22. In some embodiments, the side surface S176 of the sidewall channel structure 176 may be aligned with the side surface S310 of the spacer 310. The steps of FIG. 22 and FIG. 23 may be similar to the step of FIG. 15. In some embodiments, the length L176 of the embedded channel structures 174 may be corresponding to the dimension L310 of the formed structure of the dummy gate structure 610 and the spacer 310, when measured along the X-axis. In FIG. 24, the source/drain structures 220 are formed at the side surface S176 of the sidewall channel structure 176 and the step of FIG. 24 may be similar to the step of FIG. 10 and the step of FIG. 17. In some embodiments, the step of FIG. 16 and the step of forming the inner spacers 210 depicted in FIG. 17 may be performed between the step of FIG. 23 and the step of FIG. 24.

Figure 25:
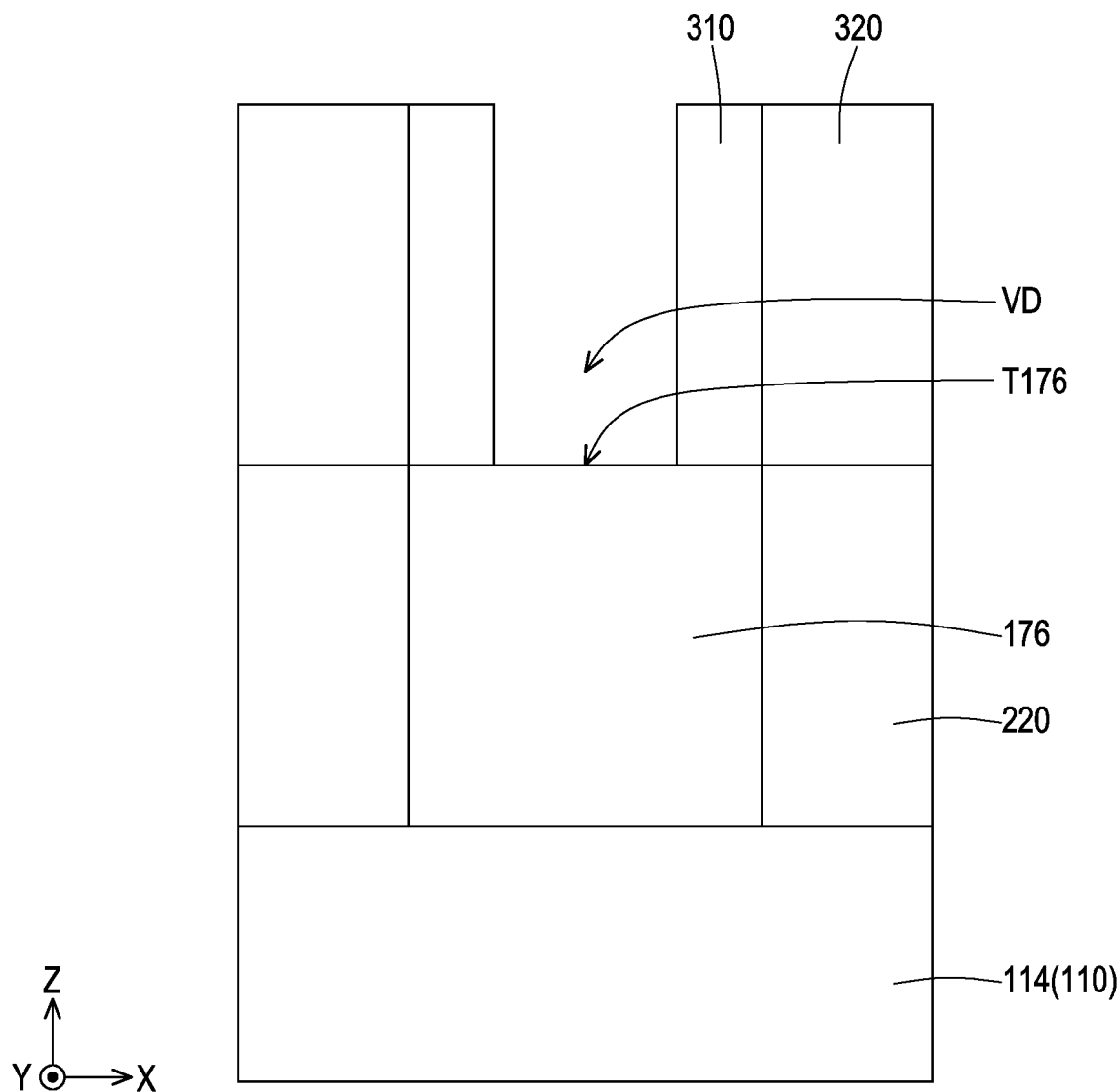
Figure 26:
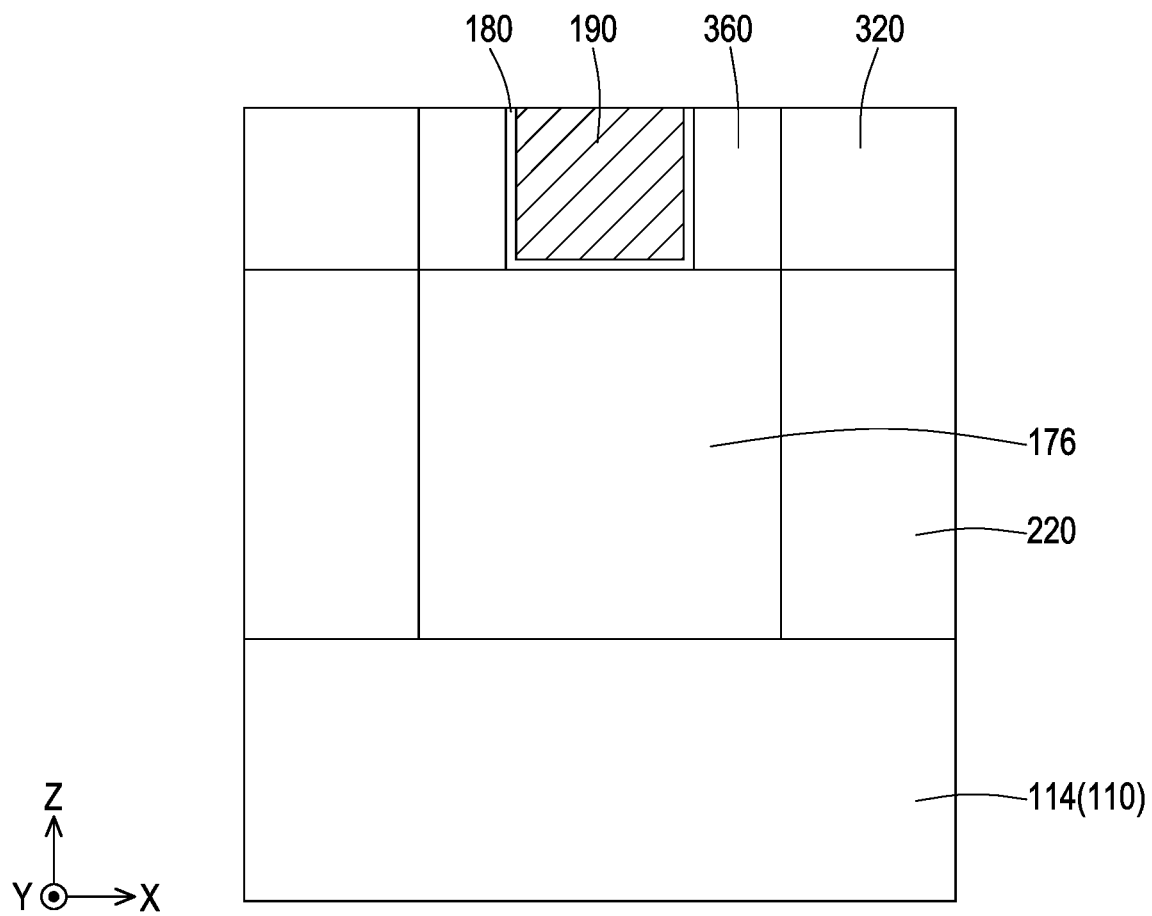
Figure 27:
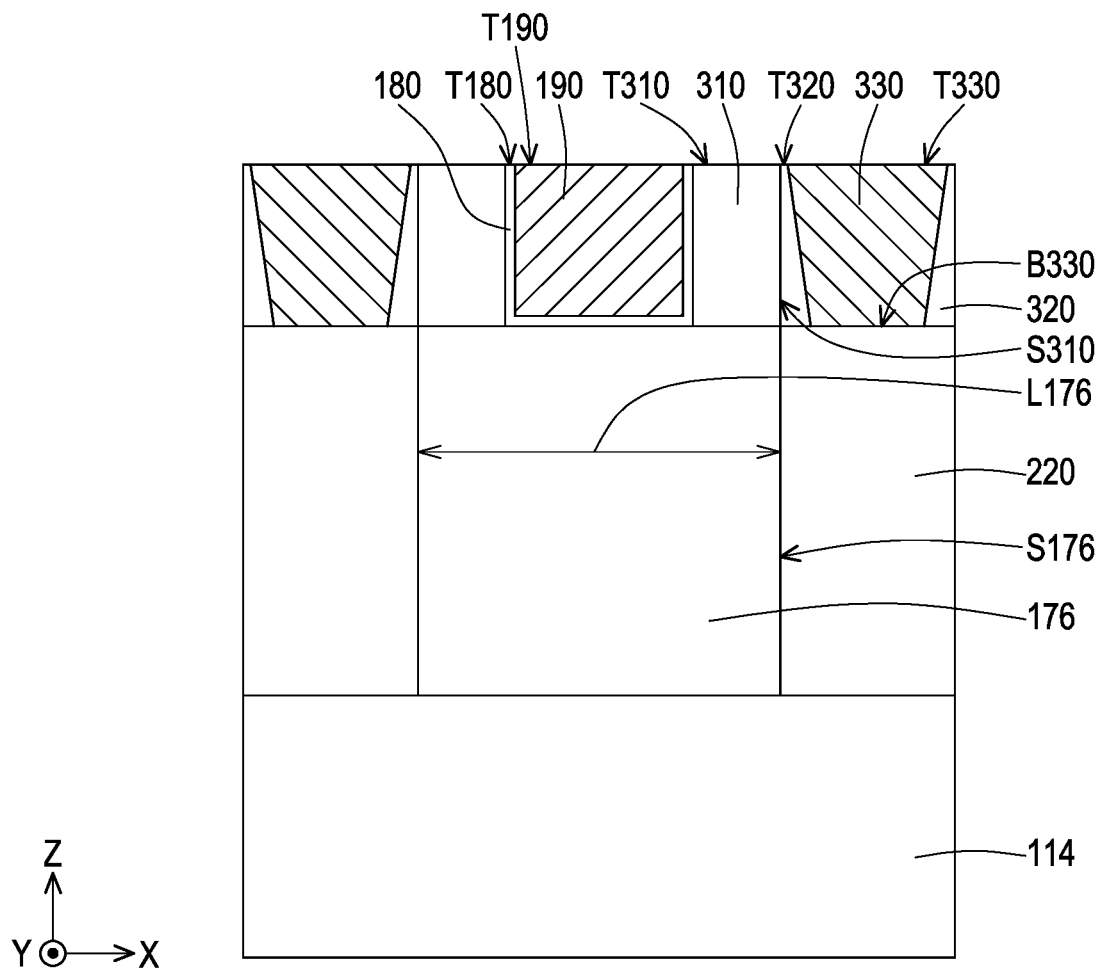

In FIG. 25, the interlayer dielectric (ILD) layer 320 is formed at the lateral side of the spacer 310 in the X-axis and the dummy gate structure 160 is removed. The ILD layer 320 includes a dielectric material such as silicon oxide, phosphosilicate glass (PSG), borosilicate glass (BSG), boron-doped phosphosilicate Glass (BPSG), undoped silicate glass (USG), or the like. The step of FIG. 25 is similar to the step of FIG. 5, the step of FIG. 11 and the step of FIG. 18. The top surface T176 of the sidewall channel structure 176 may be exposed due to the removal of the dummy gate structure 160 and the gap VD between the spacers 310 is provided. In FIG. 26, the gate dielectric layer 180 and the gate electrode structure 190 are sequentially formed in the gap VD between the spacers 310. The step of FIG. 26 is similar to the step of FIG. 6, the step of FIG. 12 and the step of FIG. 19. The materials, the forming method and the disposition of the gate dielectric layer 180 and the gate electrode structure 190 may refer to the previous embodiments. In FIG. 27, the contact metals 330 may be formed in the ILD layer 320 and in contact with the sidewall channel structure 220. Specifically, the contact metals 330 extend through the ILD layer 320 in the Z-axis so that the top surface T330 of the contact metals 330 may be co-planar to the top surface T320 of the ILD layer 320 and the bottom B330 of the contact metals 330 may be in contact with the sidewall channel structure 220. The step of FIG. 27 may be similar to the step of FIG. 20.

In FIG. 27, a semiconductor device 400 includes the isolation structure 114, the sidewall channel structure 176, the sour/drain structures 220, the gate electrode structure 190, the gate dielectric layer 180, the spacer 310, the ILD layer 320 and the metal contacts 330. The sidewall channel structure 176 and the source/drain structures 220 are disposed on the isolation structure 114. The source/drain structures 220 are located at and in contact with opposite side surfaces S176 of the sidewall channel structure 176 in the X-axis. The gate electrode structure 190 is disposed over the sidewall channel structure 176 and the gate dielectric layer 180 is disposed between the gate electrode structure 190 and the sidewall channel structure 176. The spacers 310 are disposed on the sidewall channel structure 176 and located at opposite sides of the gate electrode structure 190 in the X-axis. The outer surface S310 of spacers 310 away from the gate electrode structure 190 may be aligned with the sidewall S176 of the sidewall channel structure 176. The metal contacts 330 are disposed on the source/drain structures 220 and laterally surrounded by the ILD layer 320. The top surface T320 of the ILD layer 320, the top surface T330 of the metal contacts 330, the top surface T310 of the spacers 310, the top surface T190 of the gate electrode structure 190 and the top surface T180 of the gate dielectric layer 180 may be co-planar.

FIG. 28 to FIG. 35 schematically illustrate a method of fabricating a semiconductor device from a cross section in accordance with some embodiments of the disclosure. Referring to the X-axis, the Y-axis and the Z-axis, FIG. 28 to FIG. 35 depict the cross sections of the structures cut along line IV-IV' of FIG. 6 under respective steps. The same reference numbers in the embodiment of FIG. 28 to FIG. 35 and the previous embodiments may present the same elements or their alternatives and the descriptions for these elements in different embodiments may be applicable to each other.

Figure 28:
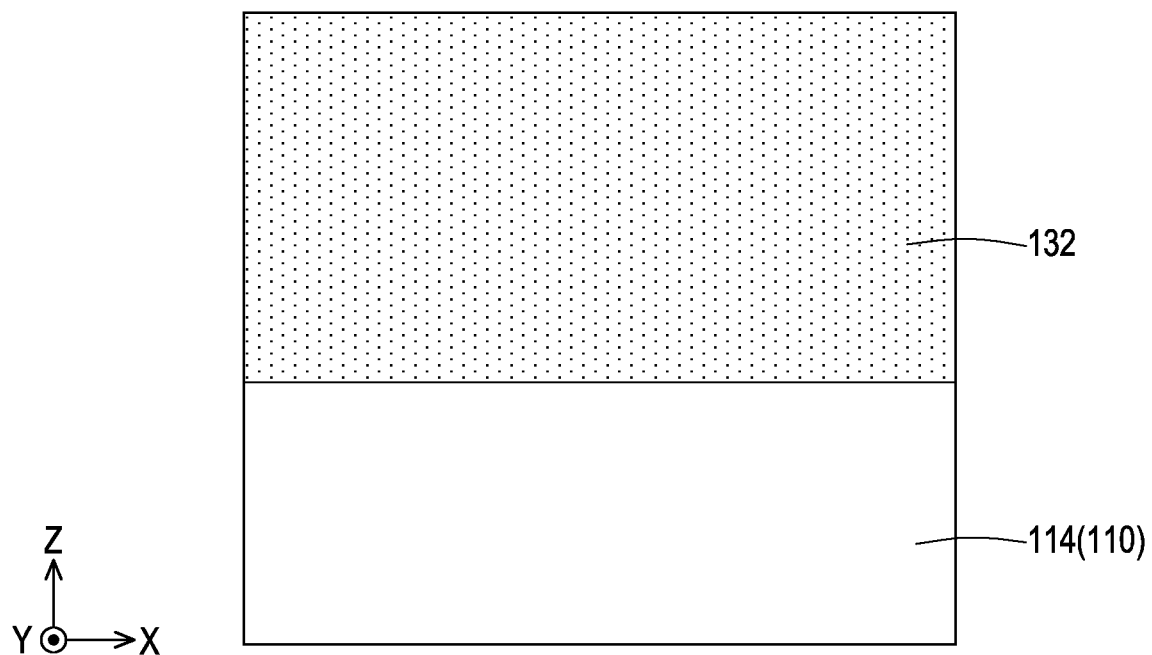
FIG. 28 to FIG. 35 schematically illustrate a method of fabricating a semiconductor device from a cross section in accordance with some embodiments of the disclosure.
Figure 29:
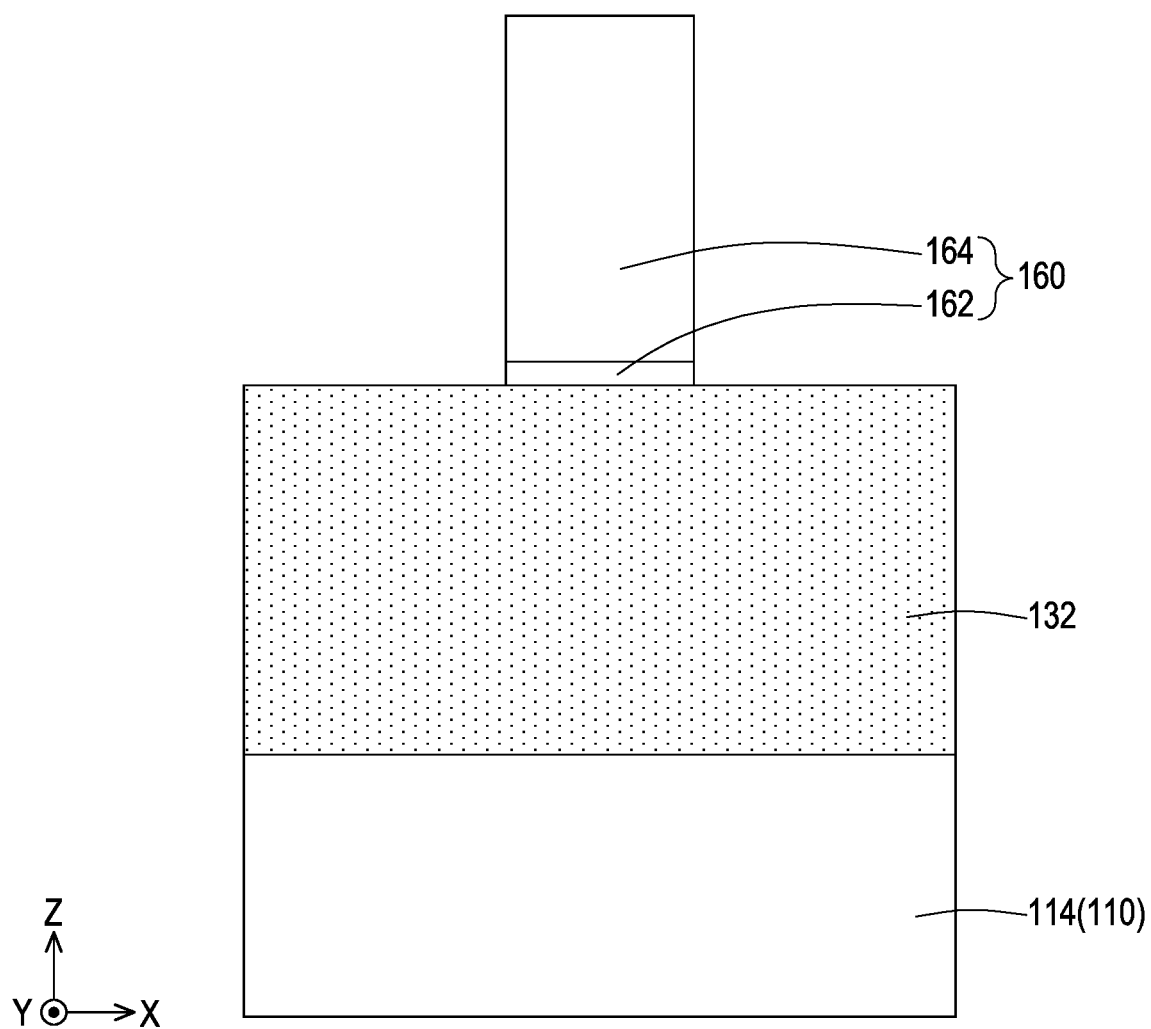
Figure 30:
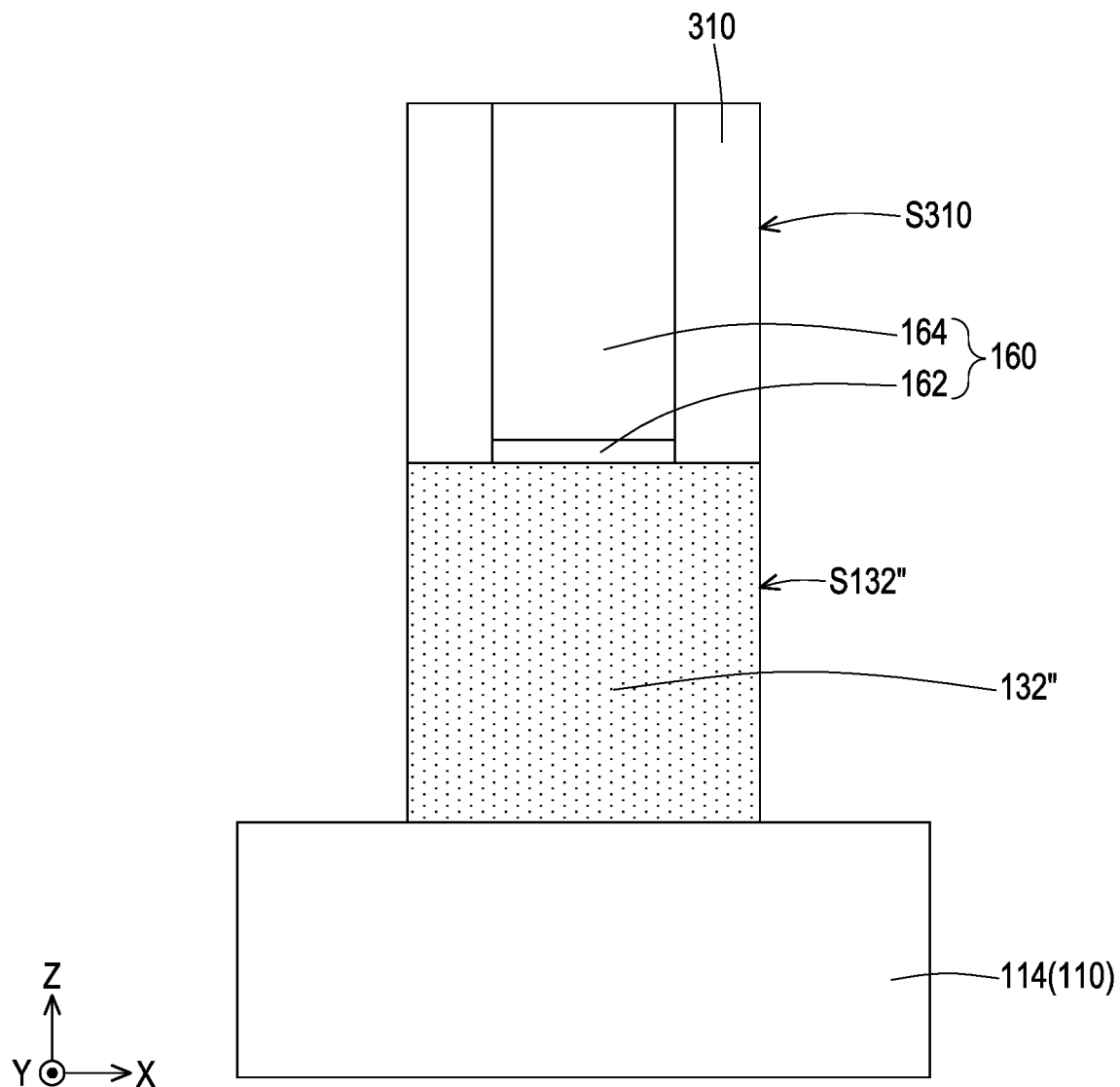
Figure 31:
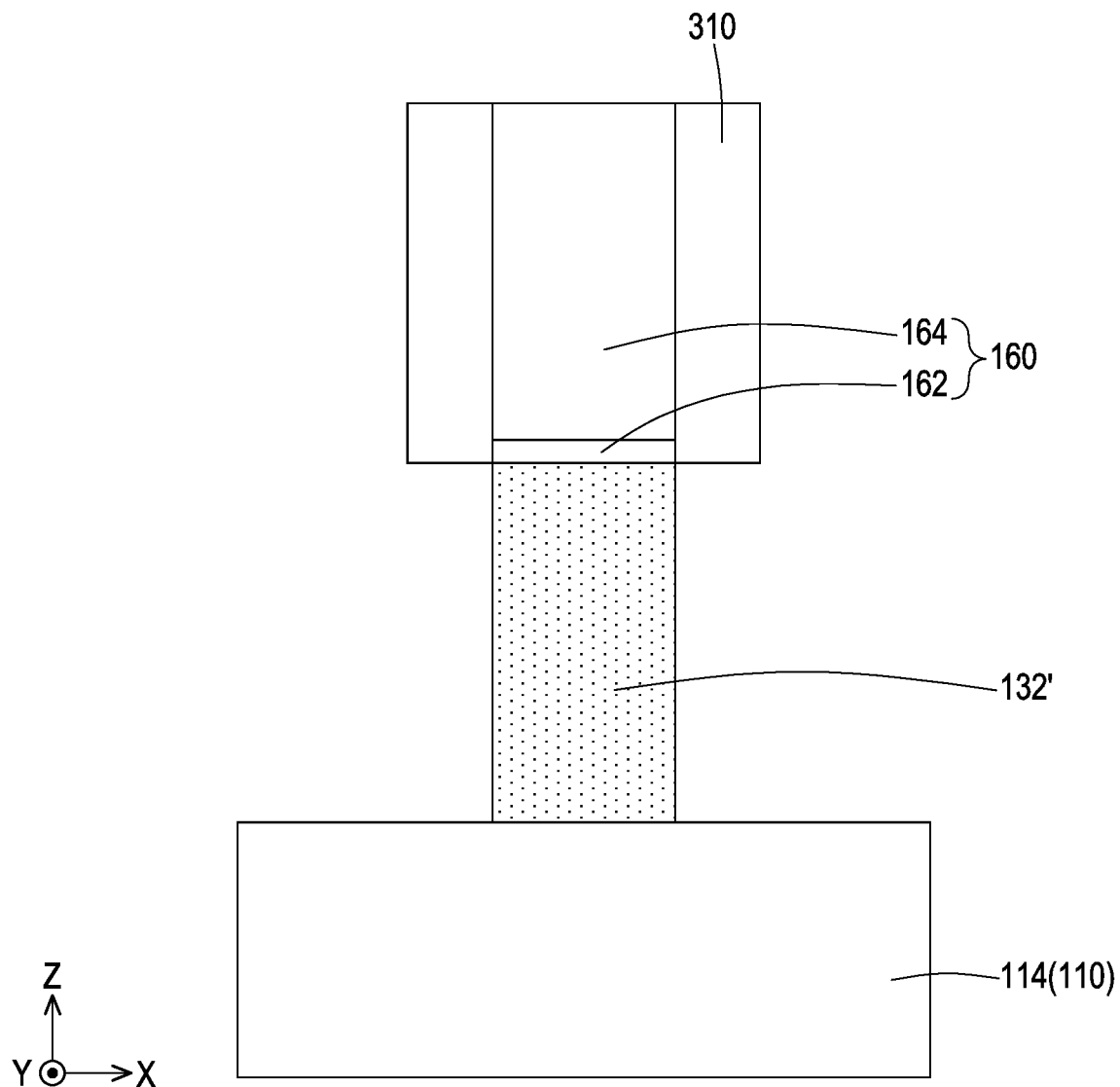
Figure 32:
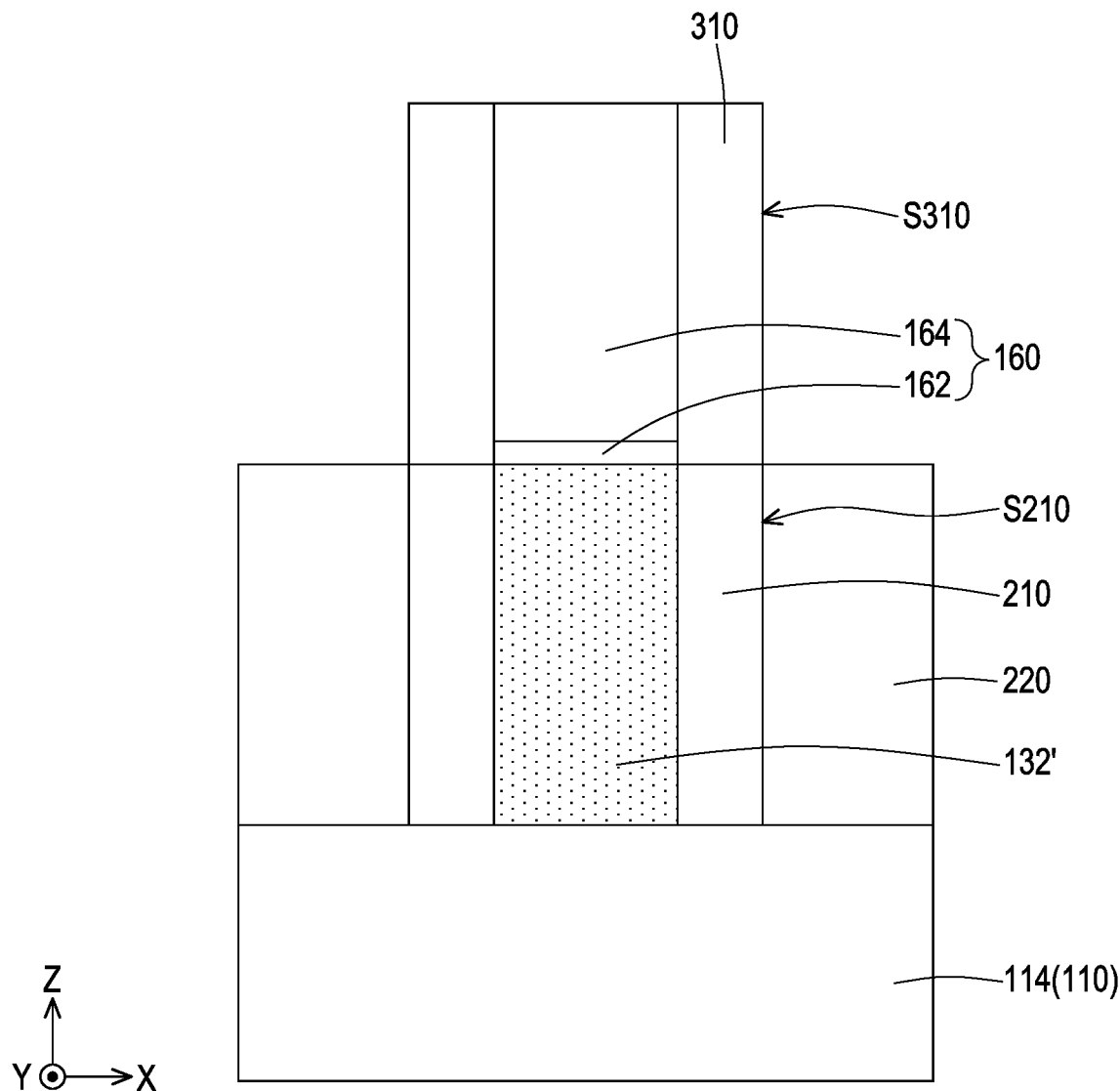

In FIG. 28, the first cap layer 132 is formed on the isolation structure 114 of the substrate 110. The step of FIG. 28 may be similar to the step of FIG. 1, the step of FIG. 7, the step of FIG. 13 and the step of FIG. 21. In FIG. 29, the dummy gate structure 160 including the gate dielectric 162 and the dummy gate structure 164 is formed on the first cap layer 132 by a method similar to the step of FIG. 4, the step of FIG. 14, and the step of FIG. 22. In some embodiments, the step of FIG. 2 and the step of FIG. 3 may be performed between the step of FIG. 28 and the step of FIG. 29. In FIG. 30, the spacer 310 is formed and a shorten first cap layer 132" is formed from the first cap layer 132. Specifically, the spacer 310 may be formed on the first cap layer 132 of FIG. 29 and a patterning process is performed on the first cap layer 132 to form the shorten first cap layer 132". In some embodiments, the side surface S132" of the shorten first cap layer 132" may be aligned with the side surface S310 of the spacers 310 away from the dummy gate structure 160. The step of FIG. 30 may be similar to the step of FIG. 15 and the step of FIG. 23. Thereafter, the shorten first cap layer 132"

is further patterned to form the shrunk first cap layer 132' as shown in FIG. 31. The step of FIG. 31 may be similar to the step of FIG. 9 and the step of FIG. 16. In some embodiments, the width of the shrunk first cap layer 132' may be the same as the dummy gat structure 160, but the disclosure is not limited thereto. In FIG. 32, the inner spacers 210 and the source/drain structures 220 are sequentially formed on the isolation structure 114 of the substrate 110. The inner spacers 210 may be formed at the lateral sides of the shrunk first cap layer 132' and the source/drain structures 220 are formed at the outer side surfaces S210 of the inner spacers 220 using the method similar to the step of FIG. 10 and the step of FIG. 17. The inner spacers 210 is disposed between the shrunk first cap layer 132' and the source/drain structures 220. The inner spacers 210 may be connected to the spacers 310 to form a continuous spacer. In addition, the side surface S210 of the inner spacers 210 may be aligned with the side surface S310 of the spacer 310.

Figure 33:
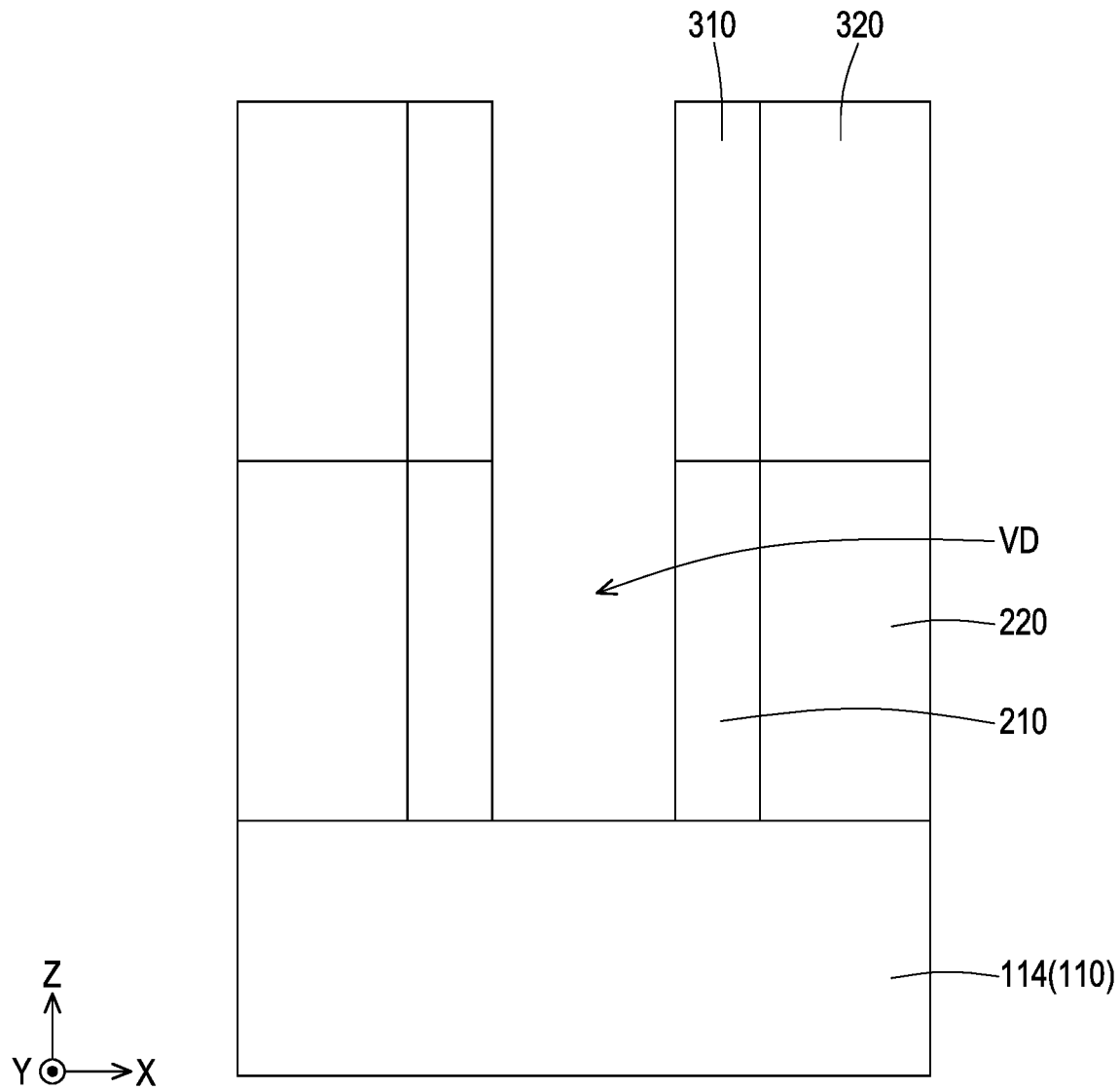
Figure 34:
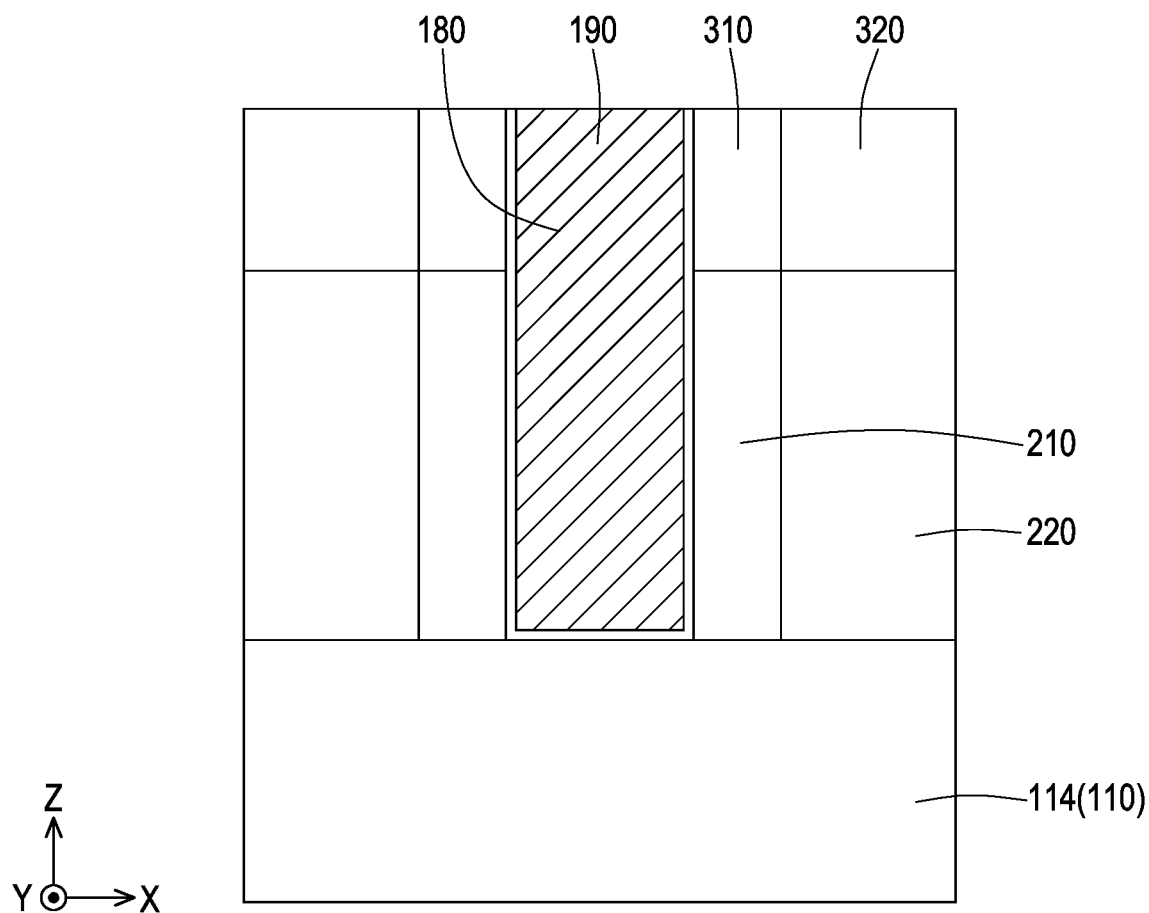
Figure 35:
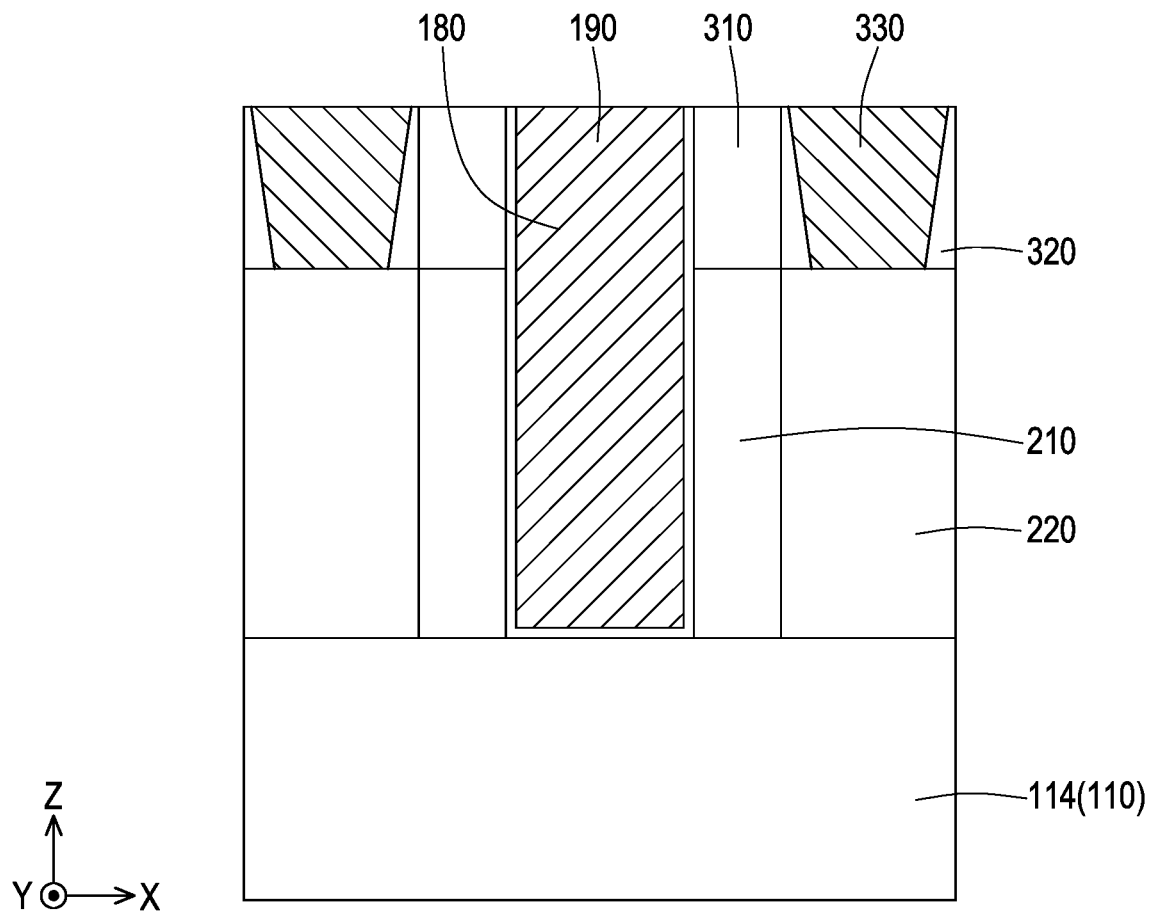

Thereafter, the dummy gate structure 160 and the shrunk first cap layer 132' are removed in sequence, which is similar to the step of FIG. 5, the step of FIG. 11, the step of FIG. 18, and the step of FIG. 28. The gap VD ash shown in FIG. 33 is provided due to the removal of the dummy gate structure 160 and the shrunk first cap layer 132'. In FIG. 34, the ILD layer 320 is also formed to laterally surround the spacers 310. In addition, the gate dielectric layer 180 and the gate electrode structure 190 are formed to fill the gap VD, which are similar to the step of FIG. 6, the step of FIG. 12, the step of FIG. 19 and the step of FIG. 29. In FIG. 35, the metal contacts 330 are formed extending through the ILD layer 330 and in contact with the source/drain structures 220.

A semiconductor device 500 as shown in FIG. 35 includes the isolation structure 114 of the substrate 110, the source/drain structures 220, the inner spacers 210, the gate electrode structure 190, the gate dielectric layer 180, the spacers 310, the ILD layer 320 and the metal contact 330. The source/drain structures 220, the inner spacers 210, and the gate dielectric layer 180 are disposed on the isolation structure 114 of the substrate 110. The gate electrode structure 190 is disposed on the gate dielectric layer 190. The spacers 310 is disposed on the inner spacers 210. The metal contacts 330 and the ILD layer 320 are disposed on the source/drain structures 220. The spacers 310 and the inner spacers 210 may be aligned and disposed beside the gate electrode structure 190. The gate dielectric layer 180 may be conformally disposed along the inner surfaces of the inner spacers 210 and the inner surfaces of the spacers 310. In some embodiments, the dimension of the inner spacers 210 and the dimension of the spacers 310 in the X-axis may be different while the gate dielectric layer 180 may be still conformally disposed along the inner surfaces of the inner spacers 210 and the inner surfaces of the spacers 310. The gate dielectric layer 180 is disposed to separate the gate electrode structure 190 from the inner spacers 210, the spacers 310, and the isolation structure 114 of the substrate 110. In addition, the tops of ILD layer 320, the metal contacts 330, the spacers 310, the gate dielectric layer 180 and the gate electrode structure 190 may be coplanar through a planarization process.

In some embodiments of the disclosure, the semiconductor device may have various shapes of channel structures to increase the channel size. For example, the semiconductor device may include the bottom channel structure formed from the protruded structure of the substrate, the embedded channel structures having sheet-like or wire-like structures, and the sidewall channel structures having wall-like structures. The sidewall channel structures having the wall-like structures requires a limited space so that the disposition of the sidewall channel structure involves the effect of increasing the channel size without significantly enlarge the device size. In some embodiments, the wall-like sidewall channel structure and the sheet-like embedded channel structure may have different crustal orientation so that the electric property of the semiconductor device may be enhanced. In the case that the channel structure in a p-type device has the crystal orientation of (110), the carrier mobility may be further enhanced.

In accordance with some embodiments, a semiconductor device may include an embedded channel structure disposed on a substrate; a sidewall channel structure disposed on the substrate, and located at a lateral side of the embedded channel structure; and a gate electrode structure disposed on the substrate, encircling the embedded channel structure and located between the embedded channel structure and the sidewall channel structure. In accordance with some embodiments, the embedded channel structure and the sidewall channel structure have different crystal orientations. In accordance with some embodiments, a dielectric fin is further disposed on the substrate, wherein the sidewall channel structure is in contact with a sidewall of the dielectric fin. In accordance with some embodiments, a gate dielectric layer is further disposed between the gate electrode structure and the sidewall channel structure, wherein the sidewall channel structure is disposed between the gate dielectric layer and the dielectric fin. In accordance with some embodiments, the embedded channel structure is separated from the substrate by a distance. In accordance with some embodiments, a bottom channel structure is further formed in the substrate, wherein the embedded channel structure is aligned with the bottom channel structure. In accordance with some embodiments, the substrate may include an isolation structure laterally surrounding the bottom channel structure, and the sidewall channel structure is disposed on the isolation structure. In accordance with some embodiments, an inner spacer is further disposed between the embedded channel structure and the bottom channel structure. In accordance with some embodiments, a source/drain structure is further disposed on the substrate and in contact with the embedded channel structure and the sidewall channel structure.

In accordance with some embodiments, a semiconductor device may include an embedded channel structure; a sidewall channel structure disposed at a lateral side of the embedded channel structure; an inner spacer disposed between the embedded channel structure and the sidewall channel structure; and a gate electrode structure surrounded by the inner spacer, the embedded channel structure and the sidewall channel structure. In accordance with some embodiments, a side surface of the inner spacer, a side surface of the sidewall channel structure and a side surface of the embedded channel structure are co-planar. In accordance with some embodiments, a gate dielectric layer further surrounds the gate electrode structure and the gate dielectric layer is surrounded by the inner spacer, the embedded channel structure and the sidewall channel structure. In accordance with some embodiments, a source/drain structure may be in contact with the embedded channel structure and the sidewall channel structure. In accordance with some embodiments, the inner spacer is disposed between the source/drain structure and the gate electrode structure. In accordance with some embodiments, a dielectric fin is further included, wherein the sidewall channel structure is disposed between the dielectric fin and the gate electrode structure. In accordance with some embodiments, a spacer is further disposed on the inner spacer and beside the gate electrode structure.

In accordance with some embodiments, a method of fabricating a semiconductor device may include forming an epitaxial stack on a substrate; forming an epitaxial cap covering the epitaxial stack; patterning the epitaxial stack and the epitaxial cap to form an embedded channel structure and a sidewall channel structure located at a lateral side of the embedded channel structure; and forming a gate electrode structure surrounding the embedded channel structure and between the embedded channel structure and the sidewall channel structure. In accordance with some embodiments, the epitaxial cap covers a top surface and a side surface of the epitaxial stack. In accordance with some embodiments, the embedded channel structure and the sidewall channel structure have different crystal orientations. In accordance with some embodiments, a dielectric fin is further formed at a lateral side of the epitaxial cap, wherein the sidewall channel structure is in contact with the dielectric fin.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
   an embedded channel structure disposed on a substrate;
   a sidewall channel structure disposed on the substrate, and located at a lateral side of the embedded channel structure, wherein the embedded channel structure and the sidewall channel structure have different crystal orientations; and
   a gate electrode structure disposed on the substrate, encircling the embedded channel structure and located between the embedded channel structure and the sidewall channel structure.

2. The semiconductor device of claim 1, further comprising a dielectric fin disposed on the substrate, wherein the sidewall channel structure is in contact with a sidewall of the dielectric fin.

3. The semiconductor device of claim 2, further comprising a gate dielectric layer disposed between the gate electrode structure and the sidewall channel structure, wherein the sidewall channel structure is disposed between the gate dielectric layer and the dielectric fin.

4. The semiconductor device of claim 1, wherein the embedded channel structure is separated from the substrate by a distance.

5. The semiconductor device of claim 1, further comprising a bottom channel structure formed in the substrate, wherein the embedded channel structure is aligned with the bottom channel structure.

6. The semiconductor device of claim 5, wherein the substrate includes an isolation structure laterally surrounding the bottom channel structure, and the sidewall channel structure is disposed on the isolation structure.

7. The semiconductor device of claim 5, further comprising an inner spacer disposed between the embedded channel structure and the bottom channel structure.

8. The semiconductor device of claim 1, further comprising a source/drain structure disposed on the substrate and in contact with the embedded channel structure and the sidewall channel structure.

9. A semiconductor device, comprising:
   a dielectric fin, wherein a gap is surrounded by a sidewall of the dielectric fin;
   an embedded channel structure disposed in the gap;
   a sidewall channel structure in contact with the sidewall of the dielectric fin, wherein the embedded channel structure and the sidewall channel structure have different crystal orientations; and
   a gate electrode structure disposed between the embedded channel structure and the sidewall channel structure.

10. The semiconductor device of claim 9, further comprising a gate dielectric layer disposed between the gate electrode structure and the sidewall channel structure.

11. The semiconductor device of claim 10, wherein the gate dielectric layer extends along the sidewall channel structure and the dielectric fin.

12. The semiconductor device of claim 10, wherein the gate dielectric layer includes a dielectric portion disposed between the gate electrode structure and the embedded channel structure.

13. The semiconductor device of claim 9, further comprising a source/drain structure in contact with the embedded channel structure and the sidewall channel structure.

14. The semiconductor device of claim 9, wherein the dielectric fin has a higher height than the sidewall channel structure.

15. The semiconductor device of claim 9, wherein the sidewall channel structure has an elongate shape extending in a Z-axis.

16. A semiconductor device, comprising:
   a bottom channel structure;
   an isolation structure disposed beside the bottom channel structure;
   an embedded channel structure disposed over the bottom channel structure;
   a sidewall channel structure disposed on the isolation structure; and
   a gate electrode structure encircling the embedded channel structure and located between the embedded channel structure and the sidewall channel structure.

17. The semiconductor device of claim 16, wherein the bottom channel structure is protruded relative to the isolation structure.

18. The semiconductor device of claim 16, further comprising a gate dielectric layer disposed between the gate electrode structure and the sidewall channel structure, between the gate electrode structure and the isolation structure and the gate electrode structure and the bottom channel structure.

19. The semiconductor device of claim 16, wherein the embedded channel structure and the sidewall channel structure have different crystal orientations.

20. The semiconductor device of claim 16, wherein the sidewall channel structure has an elongate shape extending in a Z-axis.

* * * * *